(12) United States Patent
Platzgummer

(10) Patent No.: US 9,053,906 B2
(45) Date of Patent: Jun. 9, 2015

(54) METHOD FOR CHARGED-PARTICLE MULTI-BEAM EXPOSURE

(71) Applicant: IMS Nanofabrication AG, Vienna (AT)

(72) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

(21) Appl. No.: 14/341,381

(22) Filed: Jul. 25, 2014

(65) Prior Publication Data

US 2015/0028230 A1    Jan. 29, 2015

(30) Foreign Application Priority Data

Jul. 25, 2013  (EP) .................................... 13178066
Nov. 26, 2013  (EP) .................................... 13194388

(51) Int. Cl.
*H01J 37/302*     (2006.01)
*H01J 37/317*     (2006.01)

(52) U.S. Cl.
CPC ......... *H01J 37/3026* (2013.01); *H01J 37/3177* (2013.01); *H01J 2237/31754* (2013.01); *H01J 2237/31764* (2013.01); *H01J 2237/31766* (2013.01); *H01J 2237/31774* (2013.01); *H01J 2237/31723* (2013.01); *H01J 37/3175* (2013.01)

(58) Field of Classification Search
CPC . H01J 37/302; H01J 37/3023; H01J 37/3026; H01J 37/3174; H01J 37/3175; H01J 2237/31761; H01J 2237/31764; H01J 2237/31766; H01J 2237/31767; H01J 2237/31774
USPC .............................. 250/492.1–492.22, 492.3
See application file for complete search history.

(56) References Cited

U.S. PATENT DOCUMENTS

| 3,949,265 | A |   | 4/1976 | Holl |
|-----------|---|---|--------|------|
| 4,735,881 | A |   | 4/1988 | Kobayashi et al. |
| 5,103,101 | A | * | 4/1992 | Berglund et al. .......... 250/492.2 |

(Continued)

FOREIGN PATENT DOCUMENTS

| CN | 202204836 U | 4/2012 |
|----|-------------|--------|
| EP | 1033741 A2  | 9/2000 |

(Continued)

OTHER PUBLICATIONS

European Search Report for Application No. 09450211.Sep. 1226, Report Dated Sep. 14, 2010, 4 pgs.

(Continued)

*Primary Examiner* — Jack Berman
*Assistant Examiner* — David E Smith
(74) *Attorney, Agent, or Firm* — KPPB LLP

(57) ABSTRACT

To irradiate a target with a beam of energetic radiation formed by electrically charged particles, the beam is formed and imaged onto a target, where it generates a pattern image composed of pixels. The pattern image is moved along a path on the target over a region to be exposed, and this movement defines a number of stripes covering said region in sequential exposures and having respective widths. The number of stripes is written in at least two subsequent passes such that for each pass, the widths of the stripes of one pass combine into a cover of the total width of the region to be exposed; and each pass is associated with one of a number of partial grids of pattern pixels which are exposable during the respective pass. The mutually different partial grids combine to the complete plurality of pattern pixels which compose the region to be exposed.

18 Claims, 10 Drawing Sheets

(56) References Cited

U.S. PATENT DOCUMENTS

| | | | |
|---|---|---|---|
| 5,260,579 A | 11/1993 | Yasuda et al. | |
| 5,369,282 A | 11/1994 | Arai et al. | |
| 5,399,872 A | 3/1995 | Yasuda et al. | |
| 5,814,423 A | 9/1998 | Maruyama et al. | |
| 5,841,145 A | 11/1998 | Satoh et al. | |
| 5,857,815 A | 1/1999 | Bailey et al. | |
| 5,876,902 A | 3/1999 | Veneklasen | |
| 6,014,200 A | 1/2000 | Sogard et al. | |
| 6,043,496 A | 3/2000 | Tennant et al. | |
| 6,049,085 A | 4/2000 | Ema | |
| 6,137,113 A | 10/2000 | Muraki | |
| 6,225,637 B1 | 5/2001 | Terashima et al. | |
| 6,333,138 B1 | 12/2001 | Higashikawa et al. | |
| 6,473,237 B2 | 10/2002 | Mei | |
| 6,767,125 B2 | 7/2004 | Midas et al. | |
| 6,768,123 B2 | 7/2004 | Giering | |
| 6,768,125 B2 | 7/2004 | Platzgummer et al. | |
| 6,858,118 B2 | 2/2005 | Platzgummer et al. | |
| 6,965,153 B1 | 11/2005 | Ono et al. | |
| 7,084,411 B2 | 8/2006 | Lammer-Pachlinger et al. | |
| 7,129,024 B2 | 10/2006 | Ki | |
| 7,214,951 B2 | 5/2007 | Stengl et al. | |
| 7,276,714 B2 | 10/2007 | Platzgummer et al. | |
| 7,459,247 B2 | 12/2008 | Bijnen et al. | |
| 7,687,783 B2 | 3/2010 | Platzgummer et al. | |
| 7,710,634 B2 | 5/2010 | Sandstrom | |
| 7,714,298 B2 | 5/2010 | Platzgummer et al. | |
| 7,781,748 B2 | 8/2010 | Platzgummer et al. | |
| 8,057,972 B2 | 11/2011 | Fragner et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,294,117 B2 | 10/2012 | Kruit et al. | |
| 8,378,320 B2 | 2/2013 | Platzgummer | |
| 8,546,767 B2 | 10/2013 | Platzgummer et al. | |
| 8,563,942 B2 | 10/2013 | Platzgummer | |
| 2002/0021426 A1 | 2/2002 | Mei et al. | |
| 2003/0085360 A1 | 5/2003 | Parker | |
| 2003/0106230 A1 | 6/2003 | Hennessey | |
| 2003/0155534 A1 | 8/2003 | Platzgummer et al. | |
| 2004/0058536 A1* | 3/2004 | Ki | 438/689 |
| 2004/0119021 A1 | 6/2004 | Parker et al. | |
| 2004/0157407 A1 | 8/2004 | Tong et al. | |
| 2004/0169147 A1 | 9/2004 | Ono et al. | |
| 2005/0242302 A1 | 11/2005 | Platzgummer et al. | |
| 2005/0242303 A1 | 11/2005 | Platzgummer | |
| 2006/0076509 A1 | 4/2006 | Okino et al. | |
| 2006/0169925 A1 | 8/2006 | Miyajima et al. | |
| 2008/0105827 A1 | 5/2008 | Tamamushi | |
| 2008/0128638 A1 | 6/2008 | Doering et al. | |
| 2008/0203317 A1 | 8/2008 | Platzgummer et al. | |
| 2008/0237460 A1 | 10/2008 | Fragner | |
| 2008/0283767 A1 | 11/2008 | Platzgummer | |
| 2008/0299490 A1 | 12/2008 | Takekoshi | |
| 2009/0032700 A1 | 2/2009 | Park et al. | |
| 2009/0101816 A1 | 4/2009 | Noji et al. | |
| 2009/0256075 A1 | 10/2009 | Kemen et al. | |
| 2009/0321631 A1 | 12/2009 | Smick et al. | |
| 2010/0127185 A1* | 5/2010 | Fragner et al. | 250/398 |
| 2010/0288938 A1 | 11/2010 | Platzgummer | |
| 2011/0053087 A1 | 3/2011 | Nielsen et al. | |
| 2011/0204253 A1 | 8/2011 | Platzgummer et al. | |
| 2011/0226968 A1 | 9/2011 | Platzgummer | |
| 2012/0085940 A1* | 4/2012 | Matsumoto | 250/492.3 |
| 2012/0211674 A1* | 8/2012 | Kato | 250/492.3 |
| 2012/0286170 A1* | 11/2012 | Van De Peut et al. | 250/397 |
| 2013/0164684 A1 | 6/2013 | Yamanaka | |
| 2014/0197327 A1 | 7/2014 | Platzgummer | |
| 2015/0021493 A1 | 1/2015 | Platzgummer | |

FOREIGN PATENT DOCUMENTS

| | | |
|---|---|---|
| JP | 08213301 A | 8/1996 |
| JP | 2006019436 A | 1/2006 |
| JP | 2006332289 A | 12/2006 |
| WO | 2009147202 A1 | 12/2009 |
| WO | 2012172913 A1 | 12/2012 |

OTHER PUBLICATIONS

European Search Report for Application No. 09450212.7, Report Dated Sep. 28, 2010, 9 pgs.

European Search Report for Application No. 14177851; Report Dated Oct. 16, 2014; 1 page.

European Search Report for Application No. 08450077.6, Report Dated Dec. 29, 2009, 4 pgs.

European Search Report for Application 141501197.7, Report Dated Jun. 6, 2014, 2 pgs.

European Search Report for Application No. 10450070.7, Report Dated May 7, 2012, 13 pgs.

Berry et al., "Programmable Aperture Plate for Maskless High-Throughput Nanolithography", J. Vac. Sci. Technol., Nov./Dec. 1997, vol. B15, No. 6, pp. 2382-2386.

Disclosed Anonymously, "Multi-Tone Rasterization, Dual Pass Scan, Data Path and Cell Based Vector Format", IPCOM000183472D, printed from ip.com PriorArtDatabase, Published May 22, 2009, 108 pages.

Kapl et al., "Characterization of CMOS Programmable Multi-Beam Blanking Arrays as Used for Programmable Multi-Beam Projection Lithography and Resistless Nanopatterning", Journal of Micromechanics and Microengineering, 21 (2001), pp. 1-8.

Platzgummer et al., "eMET—50keV electron Mask Exposure Tool Development based on proven multi-beam projection technology", Proc. of SPIE, vol. 7823, pp. 782308-1-782308-12.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

* cited by examiner

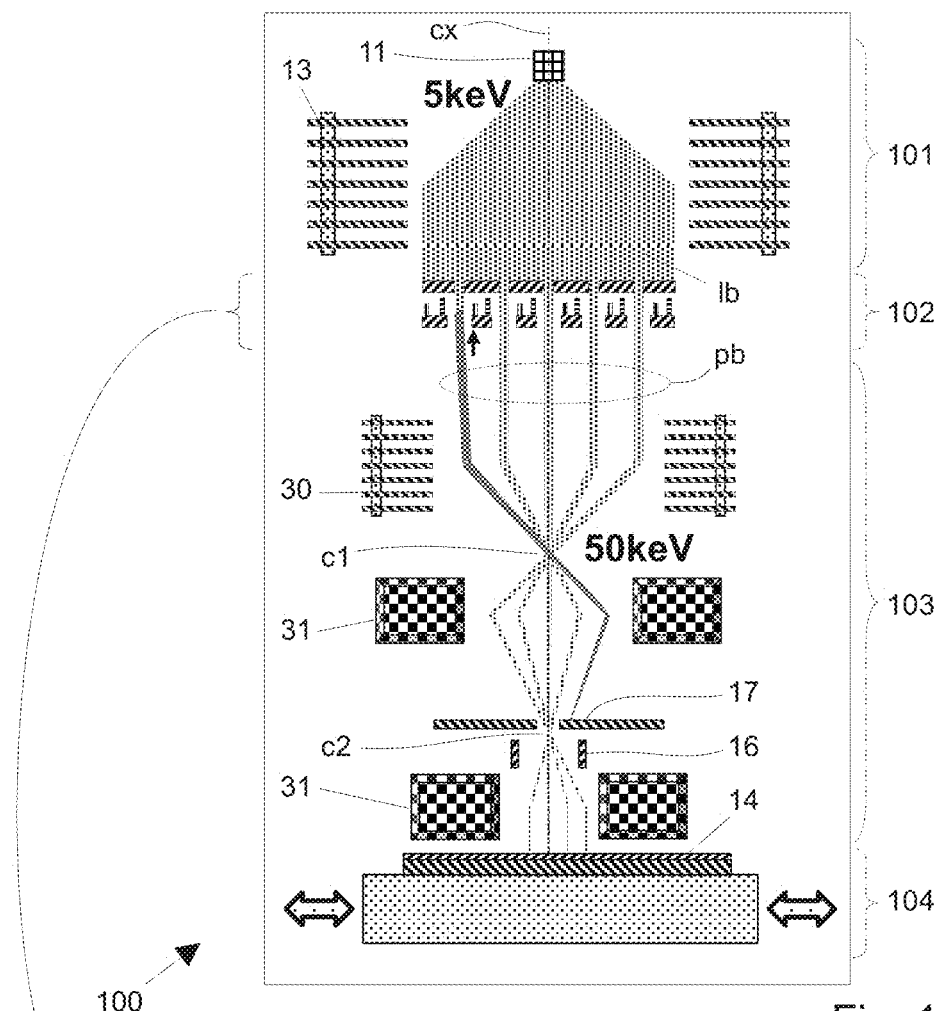
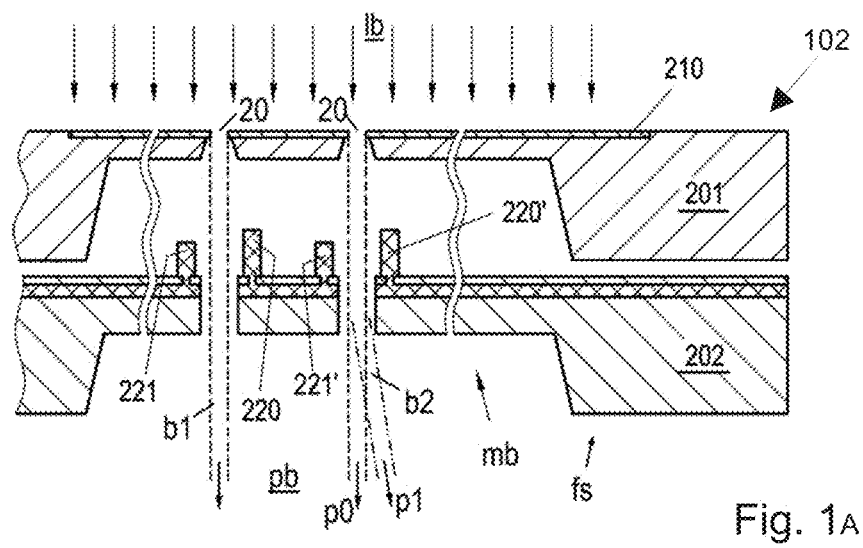
Fig. 1
Fig. 1A

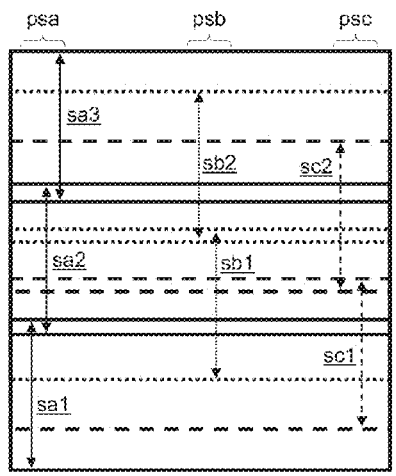
Fig. 12
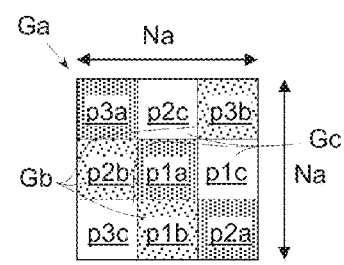
Fig. 11
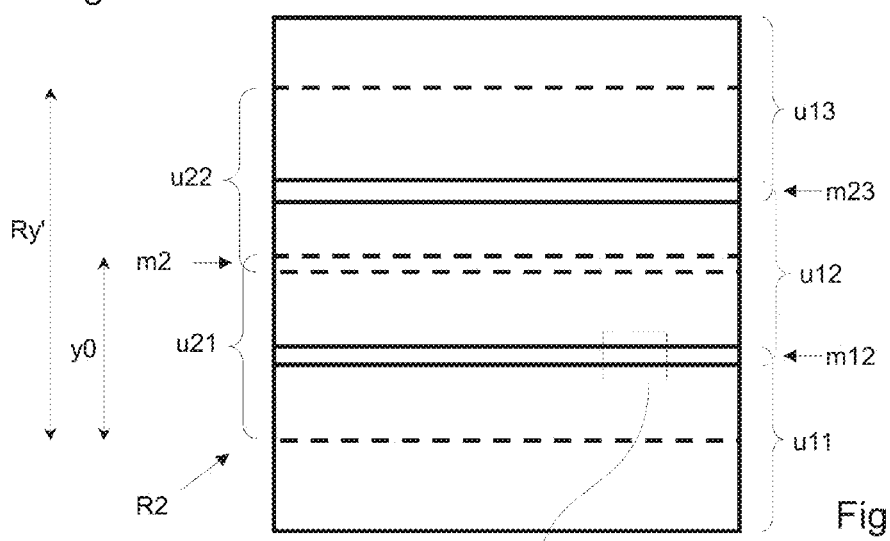
Fig. 9
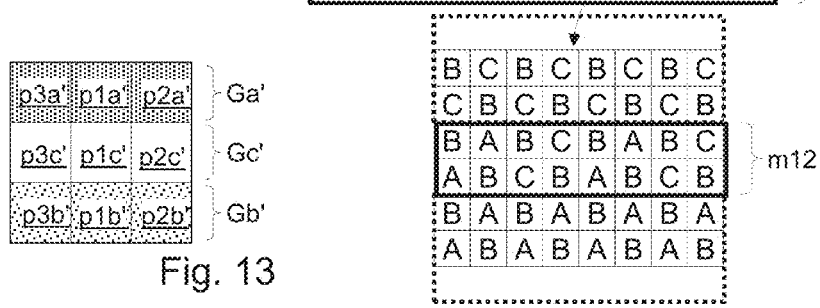
Fig. 13
Fig. 10

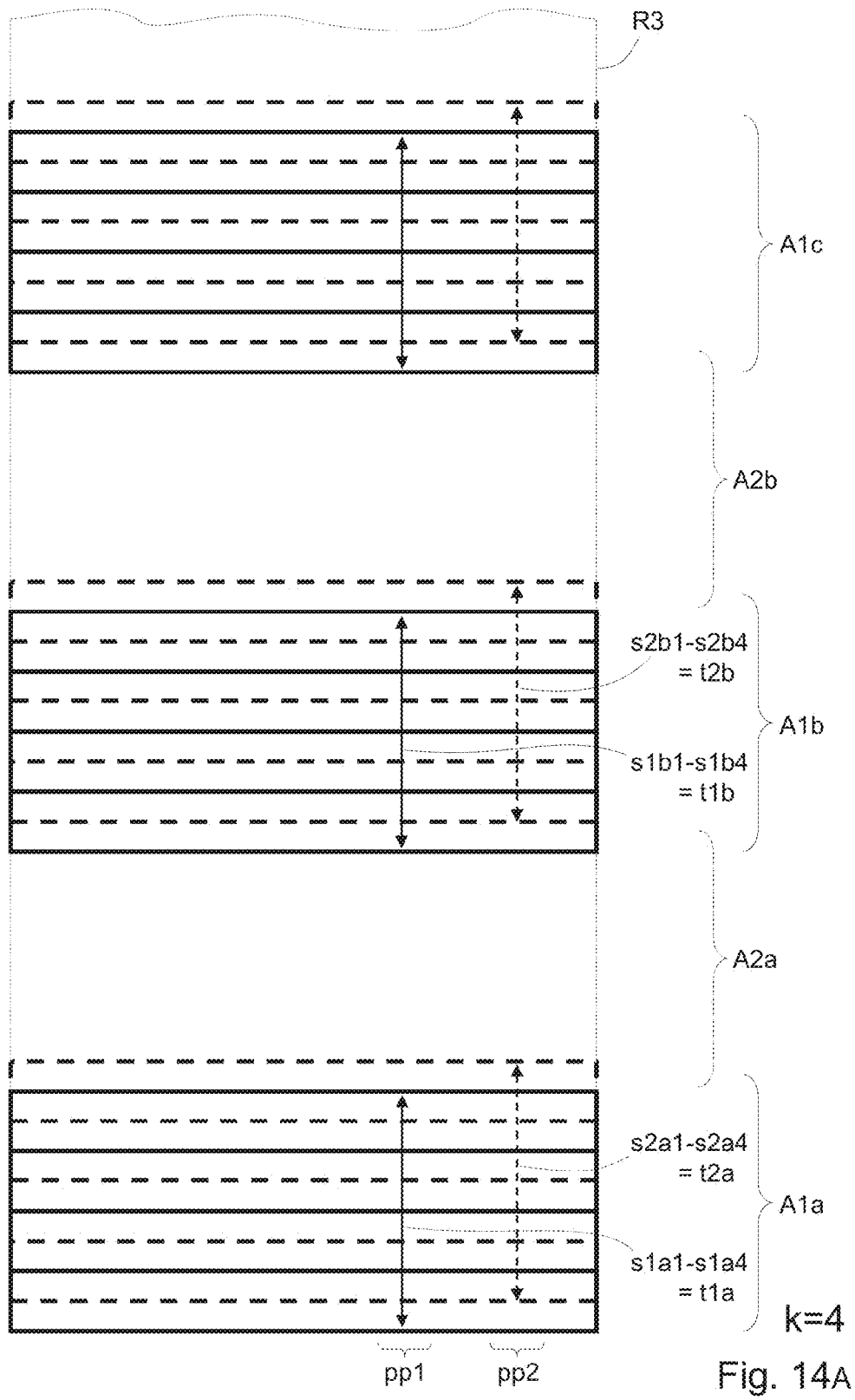

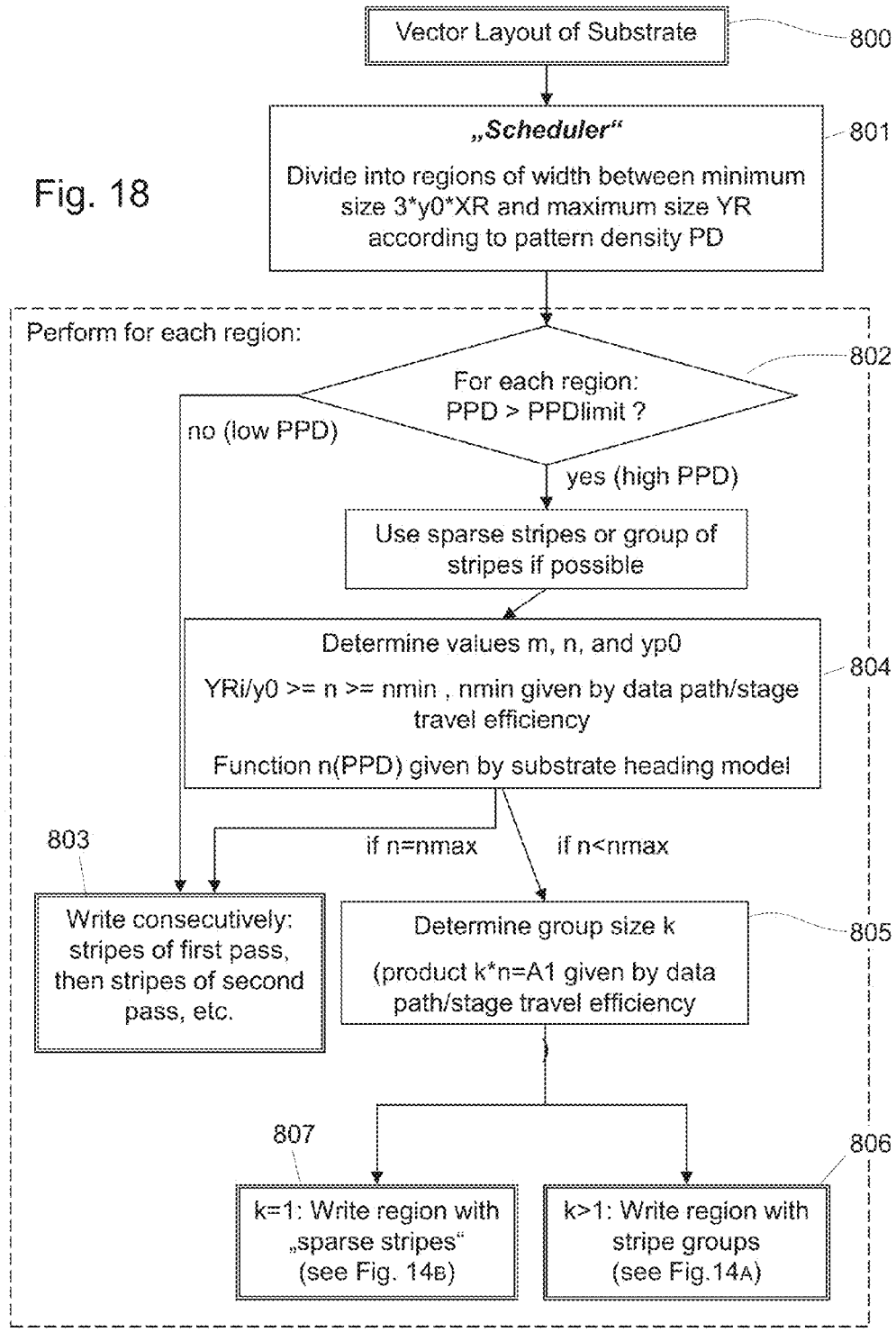

METHOD FOR CHARGED-PARTICLE MULTI-BEAM EXPOSURE

CROSS-REFERENCE TO RELATED APPLICATIONS

The present application claims priority to European Application No. 13178066.0 filed Jul. 25, 2013, and also claims priority to European Application No. 13194388.8 filed Nov. 26, 2013, the disclosures of which are herein incorporated by reference in their entirety.

FIELD OF THE INVENTION AND DESCRIPTION OF PRIOR ART

The present invention generally relates to a method for forming a pattern on a surface of a target by means of a beam formed of electrically charged particles. More in detail, the invention generally relates to a method for irradiating a target with a beam of energetic radiation formed by electrically charged particles, which comprises the steps of
  providing a pattern definition means having a plurality of apertures transparent to said radiation,
  illuminating said pattern definition means by means of an illuminating wide beam, which traverses the pattern definition means through said apertures, thus forming a patterned beam consisting of a corresponding plurality of beamlets,
  forming said patterned beam into a pattern image on the location of the target, with the pattern image comprising the images of at least part of the plurality of apertures covering a number of pattern pixels on the target where the pattern pixel corresponds to a nominal (central) position of an aperture image, and
  generating a relative movement between said target and the pattern definition means producing a movement of said pattern image on the target along a path over a region where a beam exposure is to be performed, said region being composed of a plurality of pattern pixels arranged in a regular arrangement and having a total width as measured across a main direction of said relative movement, said movement defining a number of stripes covering said region in sequential exposures, said stripes running substantially parallel to each other along said main direction and having respective widths as measured across said main direction.

A charged-particle multi-beam processing apparatus suitable for performing the method according to many embodiments of the invention is disclosed in the U.S. Pat. No. 6,768,125 of the applicant, which is hereby incorporated into the present disclosure as relevant prior art. That document describes a charged-particle lithography and processing method and apparatus dubbed PML2 (short for "Projection Mask-Less Lithography"), and publications of the applicant describe eMET (short for "electron multi-beam Mask Exposure Tool"), both of which realize a multi-beam writing concept and use a programmable aperture plate system (APS) as a pattern definition (PD) device for structuring a particle beam, which is extracted from a single source of electrically charged particles. FIG. 1 shows a multibeam processing apparatus of the eMET type with a PD device 102 in which beamlets are formed by means of apertures 20 in an aperture array plate 201 and pass through larger openings in a deflection array plate (DAP) 202; beamlets deflected in the DAP 202 are filtered out at a stopping plate 17 situated at or near the second cross-over c2 of charged-particle projection optics 103. This has the advantages that a terminal plate in the DAP is not needed, and a significantly smaller deflection angle will be sufficient to accomplish beam blanking in the DAP.

Charged-particle multi-beam lithography and processing is of high interest for nanolithography and nanopatterning applications, such as for multi-beam mask writing and for maskless multi-beam direct write processes on silicon wafer substrates. With regard to the present application the terms 'target' and 'substrate' are used without difference in meaning.

In particular electron multi-beam writing is a promising concept for the future industrial fabrication of photomasks as needed for 193 nm immersion lithography, of EUV-masks for extended ultra-violet lithography (EUVL), and of templates (1× masks) for nano-imprint lithography, in particular for sub-20 nm semiconductor technology nodes, with extendibility to sub-10 nm technology nodes. For the multi-beam mask writer the applicant has coined the acronym eMET (see above). Configurations of multi electron beam direct write (MEBDW) processing on silicon wafers in multi-column PML2 configurations are described in U.S. Pat. No. 7,214,951 and U.S. Pat. No. 8,183,543 of the applicant.

The PD device is, preferably, a programmable multi-aperture device. The implementation of a charged-particle multi-beam projection optical system based on a programmable multi-aperture plate allows a significant improvement of the achievable productivity in comparison with focused single spot beam systems as well as variable shaped beam (VSB) systems. The reasons for the improved productivity are, firstly, the parallelism of the process using a plurality of beams and, secondly, the increased current (of all beamlets writing in parallel) which can be imaged to a substrate at the same resolution. As compared with a single electron beam system, the current density at target of the electron multi-beam writing apparatus (in the order of $A/cm^2$) is lower by approx. two orders of magnitude when compared to VSB systems, thus reducing instantaneous heating effects which are unavoidable when using single beam systems with high ($>100 A/cm^2$) current density.

The layout data is usually generated in polygonal structures. For the exposure of resist images by means of a maskless pattern writing tool the layout data is converted into a pixel image data (rasterization). Therefore, the technology for maskless tools requires specific methods for data preparation. One feature of the maskless tool concept is that each pixel requires the same amount of time regardless of whether it is exposed or not.

The number of pixels required to obtain a sufficiently good feature resolution at standard chip sizes is quite high and remains a challenging task. Therefore, the storage of the complete rasterized image data is not feasible. Instead, the layout data are processed in an online rasterization which employ simple algorithms, which take only short runtime. The PML2 and eMET multi-beam direct write concepts allow for a large enhancement of the writing speed compared to single beam writers. This arises from the reduction of the required current density, the diminished importance of space charge due to the large cross section, the enhanced pixel transfer rate due to the parallel writing strategy, and the high degree of redundancy possible using a plurality of beams.

The U.S. Pat. No. 7,276,714 of the applicant discloses a pattern definition means for particle beam processing, comprising at least an aperture plate and blanking means. The apertures in the aperture plate are arranged in "interlocking grids", wherein the apertures are arranged in groups in squares or rectangles whose basic grids are meshed together. This means that the positions of the apertures taken with respect to a direction perpendicular to a scanning direction and/or parallel to it are offset to each other by not only multiple integers of the effective width of an aperture, as taken along said direction, but also by multiple integers of an integer fraction of said effective width. In this context, "scanning direction" denotes the main direction along which the image of the apertures formed by the charged-particle beam on a target surface is moved over the target surface during an exposure process.

The "interlocking grids"-solution in combination with dose control on the pixel exposed allows a finer resolution for positioning of structures or patterns on the target surface even though the individual spots formed by each image of an individual aperture are not decreased in size. Typical values of the fractional offsets are integer multiples of integer powers of ½ times the effective width of an aperture. As a consequence, the writing or placement grid for the pixels exposed may be finer than necessary for fully covering a target area (oversampling).

Furthermore, U.S. Pat. No. 7,276,714 describes the generation of gray scales by subsequent exposures of one pixel on the target by multiple apertures located in line. Thus, a shift register approach can be effectively applied to create gray scale patterns, i.e. exposure levels interpolated between a minimal and maximal ('black and white') exposure dose.

The state-of-the-art PML2 concept is a strategy where the substrate is moved continuously, and the projected image of a structured beam generates 100 percent of the gray pixels by subsequent exposures of apertures located in line. To realize gray levels, the total amount of apertures in each line may be subdivided into groups, the number of groups corresponding to the number of desired gray levels. In a recent variant described in the U.S. Pat. No. 7,777,201 by the applicant, a so called "trotting mode" writing strategy is proposed in which for each pixel one or a few beams along the (mechanical) scanning direction are used to generate the entire set of the gray pixels. The advantage of this variant is the reduced complexity of the CMOS structure and improved data management.

The particle optical system is generally non-ideal, which means that the system has imaging defects, in particular image distortions and blur variations, which additionally may vary over time, temperature and image position. In order to account for these imaging defects, rasterization algorithms are desired which can provide blur-independent writing possibilities and/or the capability to include an image pre-distortion, which is designed to compensate for optical distortions. Additionally the beam deflection angles shall be kept low to keep the distortion effects of the optical system also low.

However, the "trotting mode" method according to the above mentioned patent application has some very specific requirements on the APS layout, in particular with regard to the order of interlocking (i.e. oversampling), the order of the redundancy and the size of the aperture, which directly impacts on the aperture layout. A change of one of these parameters is generally not possible without altering the layout of the blanking plate.

The filing of the present application was triggered by the observation that the performance of a multibeam writing system is often limited by the data rate that can be processed and transferred into the PD device. For reasons related to the binary representation (the real time computation and serialization of data streams, multiplexing), the number of beamlets should be a $2^{2n}$ value where n is an integer number, in order to enable a square arrangement of beamlets. However, in the most interesting range between 316 and 1000 there is no value of $2^{2n}$. Thus, in the range of interest there is no suitable number of beamlets that would work with the known write strategy while offering the advantage of being a $2^{2n}$ number convenient for data manipulation. The only $2^n$ number in the region of interest would be 512, but this is not a simple square number.

It is an objective of many embodiments of the present invention to improve the "trotting mode" writing strategy so as to improve the addressing of imaged pixels on a writing grid and further allow a simple mapping from polygonal structures to gray level data. A further aim is to offer strategies that reduce the impact of optical imaging errors on the structures to be written using the particle beam. Further objects are improvements to reduce undesired effects of heating or charging of the resist during the exposure of a pattern on a target.

SUMMARY OF THE INVENTION

This objective is met by a method as described in the beginning, wherein the number of stripes is performed (i.e., written) in a consecutive order in at least two passes such that each stripe belongs to exactly one of said passes. Here, for each pass, the widths of the stripes of one pass combine into a cover of the total width, wherein each pass is associated with one of a number of partial grids of pattern pixels which are exposable during the respective pass. Moreover, the partial grids are mutually different and, when taken together, combine to the complete plurality of pattern pixels which compose said region where a beam exposure is to be performed.

This solution according to many embodiments of the invention modifies the "trotting mode" method in order to make it more flexible and to allow an additional redundancy scheme in order to limit the influence of local defects on or within the PD device. Furthermore, many embodiments of the invention allow for an improved tolerance against imaging errors and aberrations of the optical system. This tolerance is due to the effect that the same region on the target is exposed by beamlets originating from different regions in the PD device, thus leveling out the influence of any errors over the imaged region on the target.

Many embodiments of the invention also solve the problem described above with regard to suitable values of the number M of beamlets in a line, where M is typically a large integer, preferably $M=2^{2n}$. Splitting up the pixel grid into a number $n_g$ of subgrids (for instance, $n_g=2, 3, 4, 6, 8$), which are exposed sequentially in form of a multi-pass exposure process with specific grid offsets, obviates the requirement of having a square number of beamlets. Rather than a square number (or square power of two, $2^{2n}$) the number of pixels that can be exposed in one pass is now $n_g \cdot K^2$, preferably corresponding to M and chosen such that $K=2^n$. Hence, after a complete set of $n_g$ passes the number of pixels transferred down to the substrate is $n_g^2 K^2$, which means it achieves the identical pixel exposures as if $(n_g K)^2$ beamlets were used in a single pass exposure.

Analogous considerations apply for pixel arrangements which are not along a square (or rectangular) grid, such as a hexagonal grid.

Practically, for a convenient number of beams such as M=512 beams in one line (i.e., 262.144 beamlets in the whole array) and $n_g=2$ the above considerations yield K=16 for 512 pixels within a grid per pass. Consequently, $4 \cdot 16^2=1024$ pixels per cell can be transferred, whereas a single pass exposure would only deliver 512 pixels per exposure pass, and a number of 512 cannot be used to fill a complete grid (simple or "primitive" grid) aligned with the horizontal and vertical axis.

In one application the pattern pixels are selectively exposed according to an actual pattern to be exposed within each stripe, wherein through pixels of different partials grids different pixel locations of the actual pattern are exposable.

Suitably the partial grids according to certain embodiments of the invention are mutually disjoint with regard to nominal positions of images of apertures defining the pattern pixels, i.e., when looking at the nominal positions of the centers of aperture images, no two partial grids have such nominal positions in common.

According to one advantageous embodiment of the invention the time sequence of stripes may be such that groups of stripes belonging to the same pass are written subsequently in time.

One suitable way to distribute the stripes is that for each stripe, a boundary of said stripe having an orientation parallel to said main direction falls within a central region of a stripe of a different pass. This arrangement helps to level out potential imaging errors over the pattern image formed in the exposure on the target.

As a simple implementation, the stripes of each pass may have uniform width, and then the stripes of different passes may be offset to each other by an offset value which is substantially equal to an integer multiple of the width plus a fraction of the width, which fraction would correspond to the inverse of the number of passes.

Suitably consecutive stripes may, within each pass, be exposed at lateral offsets to each other which correspond to the respective widths of the stripes.

Furthermore, the stripes of at least one of the passes may overlap. In such a case, the range of overlap of two stripes of the same pass is suitable such that nominal positions of pattern pixels of one of the two stripes are overlapping with nominal positions of corresponding pattern pixels of the other of the two stripes. In this case the pattern pixels falling into the overlap range are exposed in at most one of the two overlapping stripes, or more generally, in the two overlapping stripes in a complementary manner with regard to the pattern to be imposed. This method allows a smooth transition between patterns imaged by the adjacent stripes, so as to once more alleviate the effect of imaging deviations at the edge of stripes.

In one advantageous embodiment of the invention, the partial grids have a pitch which is equal or smaller than the width of images of apertures, which include the pattern pixels. Here, pitch denotes the unit of displacement that can occur between placement grids, which is usually the same as the width of one pixels on the target. In a notable implementation of this development, the regular partial grids may be placement grids employing oversampling with an oversampling factor o>1; also the pitch may be equal to the aperture size times $\frac{1}{2}^{ke}$ with ke being a positive integer.

Another advantageous embodiment of the invention provides for the following procedure: During the uniformly timed exposure steps, during which respective pattern pixels are exposed on the target, the location of the pattern image is (for instance, by means of controllable deflection means located downstream of the pattern definition means) moved along with the target at least with respect to the relative movement along the main direction. Between exposure steps the location of the pattern image is changed with respect to the target, generally compensating the movement of the location of the pattern image with regard to the location of the pattern definition means. In this case, preferably the duration of said exposure steps corresponds to a uniform distance of advance along the main direction, which distance of advance is greater that the size of an aperture image (or, depending on the implementation, even greater than the mutual distance of consecutive pattern pixels, that is, of consecutive beamlets) within the same partial grid along the main direction.

In one embodiment of the invention the PD device is configured such that it comprises apertures arranged in a two-dimensional regular arrangement, such as an arrangement along a rectangular or square grid. Consequently, the positions of the images of apertures on the target (which are exposable simultaneously) are arranged according to such two-dimensional regular arrangement defined in the pattern definition means. Those nominal positions define pattern pixels which are comprised within the same partial grid.

An alternative temporal sequence of the passes is a temporally interlacing order, i.e., by writing groups of at least two stripes belonging to a respective one of the passes in immediate consecutive order (these at least two stripes may be adjacent, but not necessarily), and groups of stripes are written for alternating passes. In this case, groups of stripes covering substantially the same area on the target may preferably be written in immediate consecutive order.

A further aspect of many embodiments of the invention further reduces the effects of heating or resist charging during the exposure of a pattern on a target by applying a special ordering of the stripes: In particular, according to this aspect the stripes of each pass are distributed into at least two groups of spatially adjacent stripes, and the stripes are written either in a time sequence (a) wherein either each stripe is followed by a non-adjacent stripe of a different group, or in a time sequence (b) wherein the stripes are written in groups of stripes according to the order of the groups, with each group of stripes being followed by a non-adjacent different group.

This aspect envisages a basic approach which is reflected in the two variants (a) and (b) of the time sequence of when the stripes are written, namely, that after writing one stripe or a group of stripes, the writing process shifts to a position skipping the locations of at least one stripe or even a group of stripes.

Generally, depending on the implementation one of the mentioned variants may be employed or a combination of both variants; in the latter case, some decision method will be employed to decide whether variant (a) or (b) is used. In one embodiment, the decision between the two variants of time sequence (a) and (b) may be made based on parameters of the pattern writing process to be done, such as the pattern pixel density of the exposed pixels in the respective stripes which are to be written and/or a comparison between the number of groups per pass in the respective region and a predetermined constant A1. Thus, the total width may be divided into a number of regions, and for each region a respective value of the pattern pixel density is evaluated based on the actual pattern. Depending on a comparison between the pattern pixel density and a predetermined threshold value it is decided about the method for writing the stripes. Depending on the kind and the result of the comparison employed, the stripes are written (i.e., exposed on the target) either (a) in a time sequence wherein either each stripe is followed by a non-adjacent stripe of a different group, or (b) in a time sequence wherein the stripes are written in groups of stripes according to the order of the group, with each group of stripes being followed by a non-adjacent different group; the decision may also be made between, on one hand, one of (a), (b) or a combination of (a) and (b) and, one the other hand, (c) a time sequence wherein the stripes of each pass are written in immediate consecutive order, i.e. first all stripes of a first pass, then all stripes of the respective next pass.

BRIEF DESCRIPTION OF THE DRAWINGS

In the following, embodiments of the present invention are described in more detail with reference to the drawings, which show:

FIG. 1—an overview of a particle-beam exposure apparatus suitable for certain embodiments of the invention in a longitudinal section;

FIG. 1A—a PD device used in the apparatus of FIG. 1 in a sectional view detail;

FIG. 6B—shows the stripe resulting from the process of FIG. 6a;

FIG. 9—illustrates a variant with stripes overlapping at their edges;

FIG. 10—is a detail of an overlap margin of FIG. 9;

FIG. 11—illustrates another example of partial grids;

FIG. 12—shows the arrangement of strips for the partial grids of FIG. 11;

FIG. 13—illustrates a further example of partial grid configuration;

FIG. 14A—illustrates a variant of the temporal sequence of exposing stripes;

DETAILED DESCRIPTION OF THE INVENTION

Figure 2:
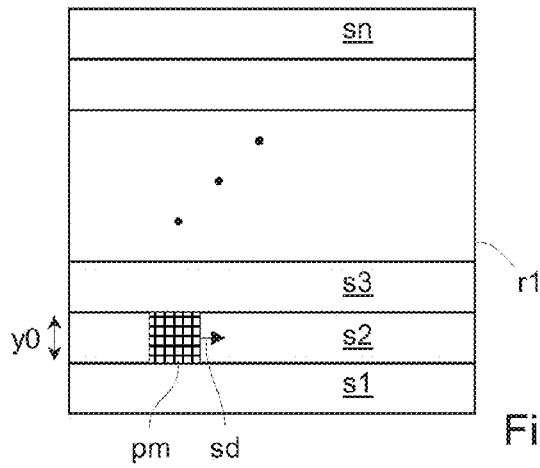
FIG. 2—illustrates the basic writing strategy on the target using stripes.

One embodiment of the invention discussed in the following is a development from the particle-beam exposure apparatus of PML2 and eMET type with a pattern definition (PD) system as disclosed in U.S. Pat. No. 6,768,125 and U.S. Pat. No. 7,781,748 of the applicant, and with a large-reduction projecting system. In the following, first the technical background of the apparatus is discussed—as far as relevant to many embodiments of the invention—, then certain embodiments of the invention is presented in detail.

It should be appreciated that the invention is not restricted to the following embodiments or the particular layout of the PD system, which merely represent one of the possible applications of the invention; embodiments of the invention are suitable for other types of processing systems that use a multi-beam setup for exposure of a target.

Charged-Particle Multi-Beam System

A schematic overview of a charged-particle multi-beam mask exposure tool (mask writer) employing an embodiment of the invention is shown in FIG. 1. In the following, only those details are given as needed to disclose the certain embodiments of the invention such that one of ordinary skill in the art can practice the respective embodiments; for the sake of clarity, the components are not shown to size in FIG. 1, particularly the lateral width of the particle beam is exaggerated. Similar to eMET are also the principles of the PML2 system; for more details, the reader is referred to the U.S. Pat. No. 6,768,125 and U.S. Pat. No. 7,781,748, whose teachings with respect to the overall layout of the particle-beam apparatus and the PD means are herewith included by reference.

A source suitable for generating an electron beam is used in the eMET system. In a variant, the beam could be realized with other electrically charged particles, in particular ions of positive charge, using an suitable ion source. A particle-optical illumination system forms the beam into a wide beam which illuminates a PD device having a regular array of apertures in order to define a beam pattern to be projected on a target surface. With each aperture, a small beam (also referred to as 'beamlet') is defined, and the passage of each beamlet through an aperture can be controlled so as to allow ('switch on') or effectively deactivate ('switch off') the passage of particles of the beam through the apertures and/or subsequent demagnifying charged-particle projection optics towards the target. The beamlets traversing the aperture array form a patterned particle beam as represented by the spatial arrangement of the apertures and including information of on-off definitions for the individual beamlets. The patterned beam is then projected by means of a demagnifying charged-particle optical projection system onto the target (for instance, a mask blank or a semiconductor wafer substrate) where an image of those apertures whose corresponding beams are not deflected is thus formed to expose or to modify the target at the irradiated portions. The images formed by the beamlets projected to the substrate form a 'pattern image', which is exposed along a straight path ("stripe") on the substrate mechanically moving in one direction; the (large-scale) motion of the substrate is usually achieved by a continuous motion of the target stage, possibly with fine adjustment of the projection system at the same time. Herein, the process of writing the pixels of a stripe onto the target (with doses according to a pattern to be exposed) is referred to as writing the stripe, or also "performing" the stripe.

The direction of movement of the image relative to the stage is also dubbed (main) scanning direction. An additional scanning of the beam in a direction perpendicular to the main scanning direction is done only within a small lateral range, for instance to compensate for lateral travel motion errors of the scanning stage and/or to include a (limited) number of parallel pixel rows, as explained more in detail below with reference to FIGS. 6A,B, as well as in the U.S. Pat. No. 8,222,621 of the applicant, which document is herewith included by reference.

The main components of the apparatus 100 are —in the order of the direction of the beam lb, pb which in this example runs vertically downward in FIG. 1—an illumination system 101, a PD system 102, a projecting system 103, and a target station 104 with the target or substrate 14. The charged-particle optical systems 101, 103 are realized using electrostatic and/or electromagnetic lenses. The charged-particle optical parts 101,102,103 of the apparatus 100 are contained in a vacuum housing (not shown) held at high vacuum to ensure an unimpeded propagation of the beam lb, pb along the optical axis of the apparatus.

The illumination system 101 comprises, for instance, an electron or ion source 11, an extractor arrangement defining the location of the virtual source, a general blanker 12 (not shown in FIG. 1), which in the case of using ion beams may also be used as particle filter, and an illumination charged-particle optics realized by a particle optical condenser lens system 13. In the embodiment shown the particle source 11 emits energetic electrons of a suitable kinetic energy such as, e.g., 5 keV; in other implementations, other electrically charged particles such as ions of primarily a certain species may be used, such as hydrogen or $Ar^+$ ions having a defined (kinetic) energy of typically several keV (e.g. 5 keV at the PD system 102) with a comparatively small energy spread of, e.g., $\Delta E=1$ eV. A velocity/energy dependent filter (not shown) may be provided to filter out other, unwanted particle species that may also be produced in the source 11; the filter may also be used to blank out the beam as a whole during repositioning of the beamlets. By means of the condenser lens system 13, the charged particles emitted from the source 11 are formed into a wide-area, substantially telecentric beam ('illuminating beam') Ib.

The beam Ib then irradiates a blanking device which, together with the devices needed to keep its position (not shown), forms the PD device 102 (which is also shown in a schematic perspective detail view at the left-hand side of FIG. 1). The PD device is held at a specific position in the path of the beam Ib, which thus irradiates an aperture array pattern formed by a plurality of apertures 20. As already mentioned, each of the apertures can be "switched on" or "off". In a "switched on" or "open" state, an aperture allows the beamlet passing through the respective aperture to reach the target; it is then said, the aperture is transparent to the incident beam. Otherwise, the aperture is "switched off" or "closed", in which case the beam path of the respective beamlet is affected (e.g. by means of deflecting electrodes to which a transverse voltage is applied) in a way that it will be absorbed or otherwise removed out of the beam path before it can reach the target; thus, the aperture is effectively non-transparent or opaque to the beam. The pattern of switched-on apertures is chosen according to the pattern to be exposed on the substrate, as these apertures are the only portions of the PD device transparent to the beam Ib, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets are shown in the patterned beam pb, while it will be clear that the actual number of beamlets is very large, i.e. typically many thousands or even in the order of millions; of the beamlets shown, the first from the left is depicted switched off as it is deflected within the PD device 102 and absorbed on a stopping plate 17, which is situated at or near the second cross-over c2 of the charged particle projection optics; the other beamlets, which are switched-on, pass through a central opening of the plate 17 and thus are projected onto the target.

The pattern as represented by the patterned beam pb is then projected by means of a charged-particle optical projection system 103 towards the substrate 14 (such as a 6" mask blank with resist coating); since the beamlets which are switched off are absorbed at the stopping plate 17, only the switched-on beamlets will form an image of the switched-on apertures. The projection system 103 implements a demagnification of, for instance, 200:1, as realized by the applicant. The substrate 14 may be, for instance, in the case of an eMET-type system a 6-inch mask blank or a nanoimprint 1× mask or master template, covered with an resist layer, whereas for a PML 2 system the substrate 14 may be a silicon wafer covered with a particle sensitive resist layer. The substrate 14 is held and positioned by a substrate stage (not shown) of the target station 104.

The projection system 103 is, for instance, composed of two consecutive charged-particle optical projector sections with a crossover c1 and c2, respectively. The particle-optical lenses 30, 31 (comprising, for instance, an electrostatic multi-electrode accelerating lens 30 and two magnetic lenses 31) used to realize the projectors are shown in FIG. 1 in symbolic form only as technical realizations of electrostatic imaging systems are well known in the prior art; in other embodiments of the invention, also magnetic and/or electromagnetic lenses may be included as suitable. The first projector section images the plane of the apertures of the PD device to an intermediate image which in turn is imaged onto the substrate surface by means of the second projector section. Both sections employ a demagnifying imaging through crossovers c1,c2; thus, while the intermediate image is inverted, the final image produced on the substrate is upright (non-inverted). The demagnification factor is about 14:1 for both stages, resulting in an overall demagnification of 200:1. A demagnification of this order is in particular suitable with a lithography setup, in order to elevate problems of miniaturization in the PD device. The charged-particle optical lenses are mainly composed of electrostatic electrodes, but magnetic lenses may also be used.

Further details of the charged-particle optical system can be found in the above-cited prior art.

As a means to introduce a small lateral shift to the image, i.e. along a direction perpendicular to the optical axis cx, deflection means 16 are provided in one or both of the projector sections. Such deflection means can be realized as, for instance, a multipole electrode system, as discussed in the U.S. Pat. No. 6,768,125. Additionally, an axial magnetic coil may be used to generate a rotation of the pattern in the substrate plane where needed. The lateral deflections are usually quite small in comparison to the lateral width of the patterned beam by itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam bp).

By virtue of the pattern formed in the PD device 102, an arbitrary beam pattern can be generated and transferred to a substrate.

Referring to FIG. 2, a pattern image pm as defined by the PD system 102 is produced on the target 14, which may, for instance, be as a resist-covered wafer. The wafer surface will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. In the embodiment shown, it is the target which effects the (large-scale) movement, so a beam-scanning strategy is not required for the large-scale movement; it is emphasized that for the purpose of many embodiments of the invention, only the relative motion of the pattern image pm on the target is relevant.

The relative movement of target and beam is realized such that the pattern image pm is moved over the area r1 so as to form a sequence of stripes s1, s2, s3, ... sn (exposure stripes). The width of each stripe corresponds to the width y0 of the pattern image pm perpendicular to the scanning direction sd.

The complete set of stripes covers the total area of the substrate surface. The scanning direction sd may alternate from one stripe to the next, but in the embodiment shown the scanning direction is the same for all stripes, for instance from the left to the right in FIG. 2 (which is generated by a corresponding motion of the target to the left), with a quick repositioning of the image from the end of one stripe to the start of the next stripe (at the right). The repositioning between stripes will generally be done using a common blank-out of the beam as described in U.S. Pat. No. 7,781,748 of the applicant.

Figure 4:
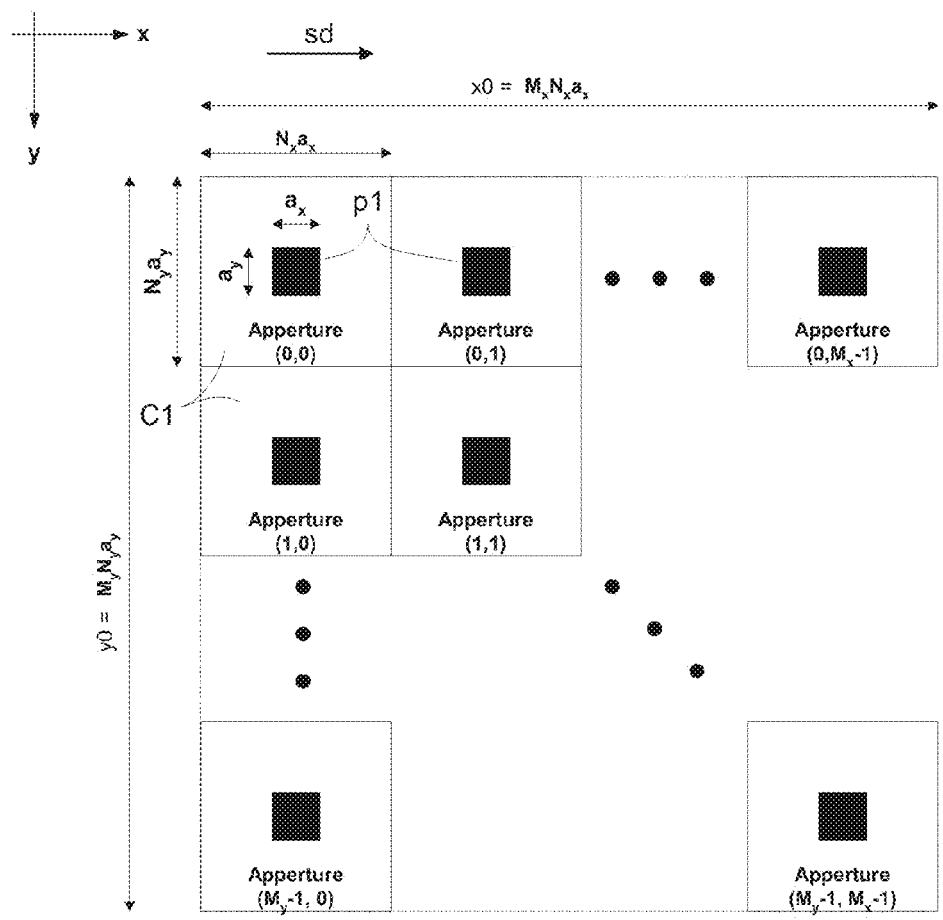
FIG. 4—shows an arrangement of apertures which can be used in certain embodiments of the invention.
Figure 3:
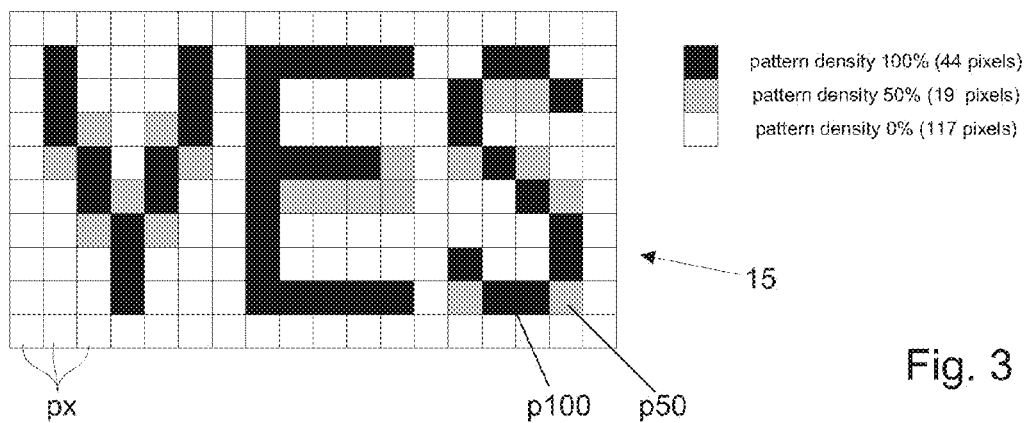
FIG. 3—shows an example of a pixel map of an exemplary pattern to be exposed.
Figure 17A:
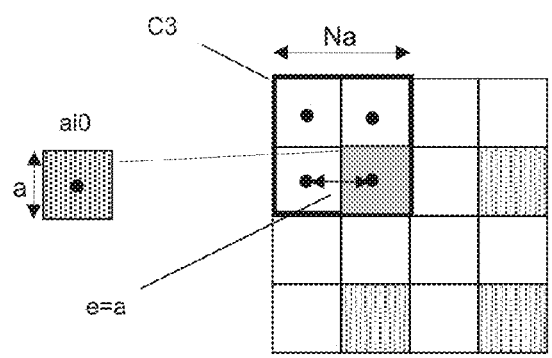
FIG. 17A—shows a further arrangement of apertures with $M_x=2$, $M_y=2$, $N_x=2$, $N_y=2$.

It will be clear from the above that the pattern image pm is composed of a plurality of pattern pixels px (FIG. 3). It should be appreciated, however, that only a subset of the pixels px can be exposed simultaneously since only a finite number of apertures is present in the aperture field of the PD system. The pixels which can be exposed simultaneously are hereinafter referred to as primary pixels p1 (see FIG. 4, which shows only one possible spatial arrangements of primary pixels). It will be appreciated that the primary pixels p1 reproduce the spatial arrangement of the apertures 20 in the aperture means 202 of the PD system 102, though at a different scale (because of the demagnification of the optical system). In the simple case of no oversampling (as shown in FIGS. 4 and 17A), the images of the apertures correspond to the primary pixels p1 one-to-one; generally, however, a pixel refers to the location of the center of an aperture image in a possibly finer placement grid so that an aperture image may cover an area larger than the area of a pixel. In a sequence of consecutive pixel exposure cycles, the pattern image pm is swept over the target (which is achieved by a movement of the target, a movement of the beam, or a proper combination of both) so as to expose all pixels px on the target in successive way.

FIG. 1A shows a PD device 102 in a detail sectional view with one aperture array plate 201 and one deflection array plate (DAP) 202, which is basically in conformance with U.S. Pat. No. 6,768,125 and U.S. Pat. No. 7,276,714 of the applicant. The illuminating beam Ib traverses the plates 201, 202 through an array of apertures 20 (equivalent to apertures ap of FIG. 4). The PD system 102 comprises a number of plates 201, 202 which are mounted in a stacked configuration, realizing a composite device whose components serve respective specific functions. Each of the plates is preferably realized with silicon microsystems technology in which the structures have been formed by micro-structuring techniques as outlined e.g. in U.S. Pat. No. 7,687,783 and U.S. Pat. No. 8,198,601. Other possible regular arrangements of the apertures in the PD system are a rectangular arrangement or an arrangement of staggered lines as described in U.S. Pat. No. 6,768,125.

The first plate in the direction of the incoming beam is an aperture array plate or short aperture plate 201. It absorbs the majority of the impingent charged particle beam Ib, but the charged particles can pass through a number of apertures 20 of defined shape, thus forming a plurality of beamlets, of which only two beamlets b1, b2 are shown for the sake of better understanding. Apart from the task of forming the beamlets, the aperture plate 201 serves to protect the subsequent plate(s) from irradiation damage. In order to avoid local charging the aperture plate may be coated with an appropriate layer 210, usually a metallic layer forming no oxide (e.g. iridium). When using ion beams, the layer 210 and method of its formation are chosen suitably to prevent the irradiating particles to be incorporated in the silicon crystalline matrix, which would cause a change of membrane stress, as outlined in U.S. Pat. No. 6,858,118.

Following the aperture array plate 201 downstream, a deflector array plate 202 (DAP; also referred to as blanking plate in view of its function in the context of the apparatus 100) is provided. This plate serves to deflect selected beamlets and thus to alter their beam path. The DAP has a plurality of so called blanking openings, which each correspond to a respective aperture of the aperture array plate 201. As mentioned above and shown in FIGS. 1 and 1A, the blanking openings in the DAP are larger than the openings in the aperture array plate.

Each blanking opening in the DAP is provided with a beamlet deflection means formed by electrodes 220, 221, 220', 221', which allows to individually deflect charged particles transgressing through the opening, thus diverting the beamlet traversing the opening off its path. For instance, beamlet b1 transgresses the subsequent larger opening of the pattern definition system 102 without being deflected, since the beamlet deflection means formed by the respective set of beamlet deflection electrodes is not energized, meaning here that no voltage is applied between the active electrode 221 and the associated ground electrode 220. This corresponds to the "switched-on" state of the aperture. Beamlet b1 passes the pattern definition system 102 unaffected and is focused by the particle-optical system through the crossovers and imaged onto the target with a reduction as induced by the charged-particle projection optics. For example, in systems implemented by the applicant, a reduction factor as large as 200:1 was realized. In contrast, as shown with beamlet b2, a "switched-off" state is realized by energizing the beamlet deflection means of this aperture, i.e. applying a voltage to the active electrode 221' with regard to the corresponding ground electrode. In this state, the beamlet deflection means formed by electrodes 220',221' generates a local electric field across the path of the corresponding beamlet b2 and thus deflects the beamlet b2 off its normal path p0 to a deflected direction. As a consequence the beamlet will, on its way through the charged-particle optical system, obey an altered path p1 and be absorbed at an absorbing means provided in the optical system, rather than reaching the target. Thus, beamlet b2 is blanked. The beam deflection angle is largely exaggerated in FIG. 17; it is, in general, very small, typically 0.2 to 1 thousands of a radian.

The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target. For the description herein, however, the realization of the actual pattern is irrelevant. Therefore, in the following description, the fact that individual selected beamlets may be switched off is left out of consideration; all beamlets are always shown as switched on (active on the target), as if the pattern exposed is a full cover of the target area. It should be kept in mind that in an actual implementation a pattern will be superimposed which will require that a considerable number of the beamlets will be switched off in the course of irradiation of the target.

The figures discussed in the following, unless noted otherwise, are views of an area on the surface of the target (plan views) as seen in direction of the beam.

Dose Levels

While the substrate 14 is moved continuously, the same image element on the target, i.e., pattern pixel px, is covered many times by the images of a sequence of apertures during the same scanning movement, as discussed in detail below with reference to FIGS. 6A-C. Simultaneously, the pattern in the PD system is shifted, step by step, through the apertures of the PD system. Thus, considering one image element at some location on the target, if all apertures are switched on when they cover that image element, this will result in the maximum exposure dose level: a "white" shade corresponding to 100%. In addition to a "white" shade, it is possible to expose an image element at the target according to a lower dose level (also dubbed 'gray shade') which would interpolate between a the minimal ('black') and maximal ('white') exposure dose levels. A gray shade may, for instance, be realized by switching on a corresponding number of apertures in the line; for example, 8 out of 32 apertures would give a gray level of 25%; another approach is to reduce the duration of unblanked exposure for the apertures involved. Thus, the signal controlling the value of an image element is represented by a gray scale code, for example an integer number coded as a binary number of n bits. There may be different numbers of gray shades.

FIG. 3 shows a simple example of an imaged pattern 15 with a size of 10×18=180 pixels, where some pixels p100 of the exposure area are exposed to a gray level of 100% and other pixels p50 are exposed to only 50% of the full gray level. The remaining pixels are exposed to a 0% dose (not exposed at all). Of course, in a realistic application of many embodiments of the invention, the number of pixels of the standard image would be much higher. However, in FIG. 3 the number of pixels is only 180 for the better clarity. Also, in general, much more gray levels will be used within the scale from 0% to 100%.

FIG. 4 shows the arrangement of primary pixels p1, i.e., pixels that are exposable at one time on the target, according to a basic layout and also illustrates several quantities and abbreviations used in the following. Shown is the arrangement of the aperture images as projected onto the target, forming primary pixels p1, shown in dark shades. The main axes X and Y correspond to the direction of advance of the target motion and the perpendicular direction, respectively. Each aperture has widths $a_x$ and $a_y$ along the directions X and Y respectively. The apertures are arranged along lines and rows having $M_x$ and $M_y$ apertures, respectively, with the offset between neighboring apertures in a line and row being $N_x$ and $N_y$ respectively. As a consequence, to each aperture belongs a conceptual cell C1 having an area of $N_x a_x \times N_y a_y$, and the aperture arrangement contains $M_x M_y$ cells arranged in a rectangular way. In the following, these cells C1 are referred to as 'exposure cells'. The complete aperture arrangement, as projected onto the target, has dimensions of $x0=M_x N_x a_x$ by $y0=M_y N_y a_y$.

In the discussion hereinafter, we will assume a square grid as a special case of a rectangular grid, and set $a=a_x=a_y$, $N=N_x=N_y$, and $M=M_x=M_y$, with M being an integer, for all further explanations without any restriction of the generality. Thus, an 'exposure cell' has a size of $(Na)^2$ on the target substrate.

The distance between two neighboring exposure positions (that is, between pixels, from center to center) is denoted as e in the following. In general, the distance e can be different from the width a of an aperture image. In the simplest case, a=e, as shown in FIG. 17A for the example of an arrangement of 2×2 exposure cells C3, and one aperture image ai0 (or 'primary pixel' p1) covers (the nominal position of) one pixel.

Figure 17B:
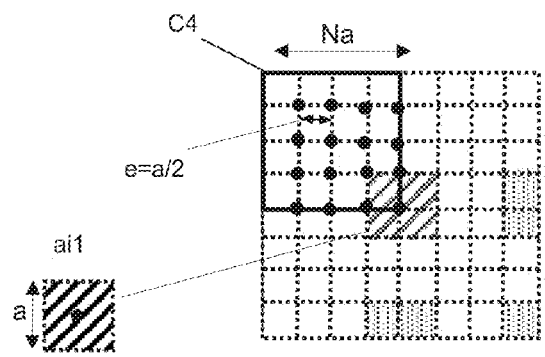
FIG. 17B—shows an example of a pixel placement grid that is finer than the size of the image of an aperture (oversampling) in comparison to FIG. 17A FIG. 18—shows a flow diagram of the algorithm employed for writing groups of stripes.

In another interesting case, illustrated in FIG. 17B (and in line with the teachings of U.S. Pat. No. 8,222,621 and U.S. Pat. No. 7,276,714), e can be a fraction a/o of the width a of the aperture image, with o>1 being an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels, and the entire area of the aperture field as imaged to the target will comprise $(NMo)^2$ image elements.

From the point of view of placement of aperture image, this oversampling corresponds to a so-called placement grid which differs (since it is finer in spacing) than what would be necessary to simply cover the target area. FIG. 17B illustrates one example of placement grids, in particular the image of an aperture array with an exposure cell C4 having parameters N=2 and $M_x=M_y=2$ (like in FIG. 17A), as well as an oversampling of o=2. Four aperture images ai1 (dashed lines) are printed on nominal locations being offset from the nominal locations on a regular grid with pitch e in both X and Y directions. While the size of the aperture image still is of the same value a, the pitch e of the placement grid is now a/o=a/2. The offset to the nominal location (offset of the placement grid) is also of size a/2. At the same time, the dose and/or the gray shade of each pixel may be adapted (reduced). As a result, an area of size a is printed but with an enhanced placement accuracy due to the finer placement grid.

Direct comparison of FIG. 17B with FIG. 17A shows that locations of aperture images are just arranged on a placement grid twice as fine as before (while the aperture images themselves overlap). The exposure cell C4 now contains $(No)^2$ locations (i.e., "pixels") to be addressed during the write process and thus, by a factor of $o^2$, more pixels than before. Correspondingly, the area ai1 with the size of an aperture image a×a is associated with $o^2=4$ pixels in the case of oversampling with o=2 in FIG. 17B.

The following description of some embodiments of the invention thus relates to the general case of placements grids with arbitrary grid offsets and a pitch of the placement grid being equal or smaller that the size of an aperture image a.

Exposure of Pixels Using Partial Grids

Figure 5:
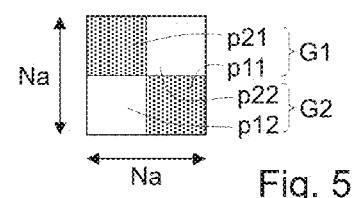
FIG. 5—illustrates the association of pixels in an exposure cell to partial grids.

FIGS. 5 to 8 show an example of the exposure scheme of the pixels according to an exposure method in accordance with an embodiment of the invention, for parameters o=1, N=2. Referring first to FIG. 5, one exposure cell is shown as representative for all exposure cells in which pixels are exposed. The exposure cell comprises $N^2=4$ pixels, denoted p11, p12, p21, and p22, respectively. According to many embodiments of the invention, the pixels are divided into different sets, which are referred to as 'partial grids' or simply 'grids' G1, G2, which preferably contain the same number of pixels, preferably in corresponding arrangements. Usually the number of partial grids, $n_g$, is chosen so as to be the same as the width count N of the exposure cell; thus, in this case, $n_g=2$. In the example shown, pixels p11, p21 form a first grid G1, and pixels p12, p22 belong to a second grid G2. The partial grids G1, G2 contain different pixels, but when taken together, they combine to the complete number of pattern pixels within the cell. In the embodiment shown, the position of the pixels belonging to the same grid are chosen such that each row and each column of the (quadratic) exposure cell contains just one pixel of each grid.

Figure 6A:
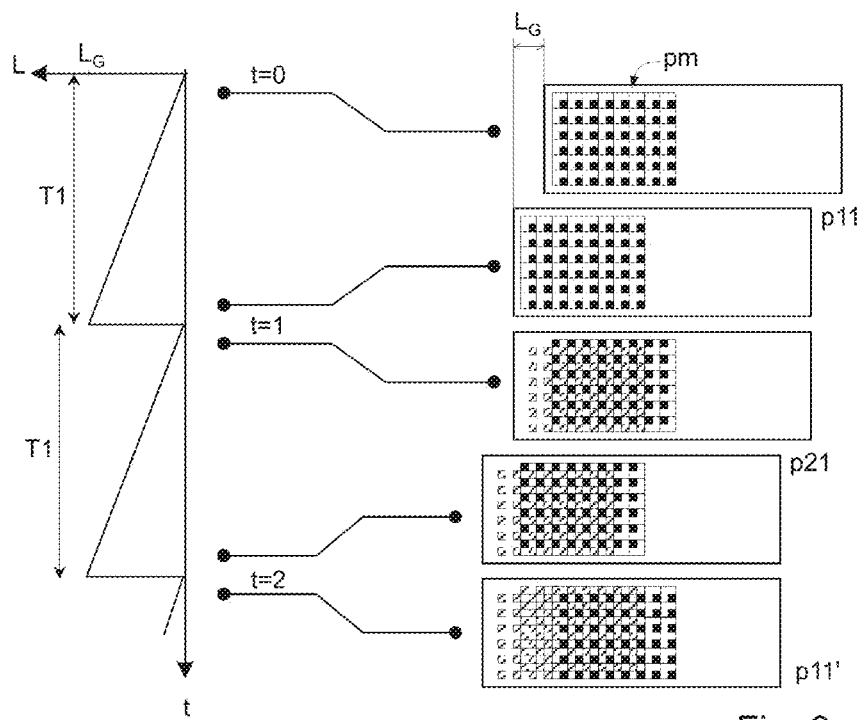
FIG. 6A—illustrates the exposure of one stripe.
Figure 6B:
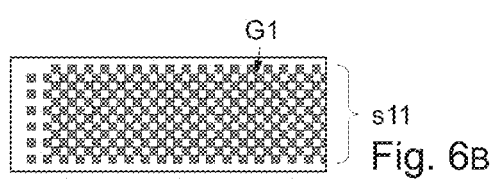
Figure 6C:
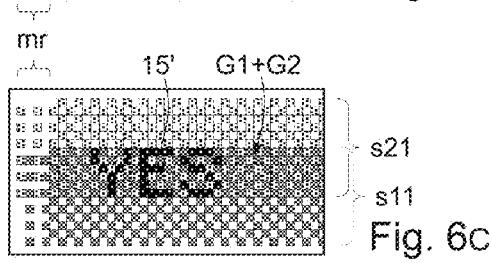
FIG. 6C—shows two overlapping strips of different passes.

FIGS. 6A to 6C illustrate the process of exposing an area on the target according to many embodiments of the invention. FIG. 6A illustrates how one stripe is exposed. Shown is a sequence of frames, with increasing time t from top (earlier) to bottom (later). Pixels which are being exposed are shown dark (regardless of their actual amount of exposure as defined by the grey level to be imparted), and pixels which have previously been exposed are shown with a dot hatching. The parameter values in this figure are o=1, N=2; also, a rectangular beam array is assumed with $M_x=8$ and $M_y=6$. The target moves continuously to the left, whereas the beam deflection is controlled with a seesaw function as shown on the left side of the figure. During each time interval of length T1, the beam image stays fixed on a position on the target. Thus, the beam image is shown to go through a sequence of positions p11, p21, p11' which correspond to the pixel locations of FIG. 5 of same denomination. According to many embodiments of the invention, in one stripe, the pixels belonging to one grid are exposed; thus, FIG. 6A shows the process of exposure of a first stripe s11, which is associated with the first grid G1. The position p11' in FIG. 6A represents the start of a new cycle within grid G1 at pixel p11, but with an additional longitudinal offset $2L_G$. It is to be noted that in position p11' many pixels are covered which were covered in position p11 as well; in fact, over the course of the stripe s11, one pixel can be exposed during a plurality of times, which allows to define gray shades as explained above in section 'Gray Shades'. The process is repeated over the complete length of the stripe s11, in order to expose all the pixels in the stripe belonging to the associated grid G1.

Thus, vertically positioned horizontal lines of beamlets with a vertical distance of the cell size Na allow a parallel writing of pixels on the target, whereas the plurality of lines of beamlets form a "scanning comb" which enables exposing a stripe are which has the lateral width y0 of the cell.

The time of exposure T1 at each position p11, p21, . . . corresponds to a length by virtue of the target motion, $L_G = v \cdot T1$, which we call "exposure length". Thus, one cycle of pixels of a grid is exposed within a time interval $n_g T1$.

The beamlets are moved together with the target over the distance of $L_G$ during the exposure of a set of pixels corresponding to the same pixel position within a cell by applying deflection voltage to the deflectors 16 (FIG. 1). In other words, all beamlets maintain a fixed position with regard to the surface of the substrate during the time interval T1. After moving the beamlets with the target along a distance $L_G$, the beamlets are relocated instantaneously (within a very short time) to start the exposure of the next set of pixels within the grid. The stage movement is to the left in the figure, producing an overall scanning movement of the pattern image to the right. After a full cycle through the positions p11, p21 of grid G1, the sequence starts anew. It will be clear from the above, see FIGS. 6A and 6B, that with the completion of a full cycle of pixels within a grid, the overall displacement is parallel to the X direction (scanning direction) and has an accumulated length of $L = n_g \cdot L_G$, while the perpendicular components of the individual offsets cancel out mutually. The value of the exposure length is chosen suitably, preferably as an integer multiple of the width of the pixels p1 and preferably so as to be larger than the longitudinal distance between pixels p1 (or equivalently, between beamlets) on the target. (Longitudinal distance means a distance as measured along the main scanning direction sd.)

With this method it is possible to write stripes of arbitrary length, exposing all pixels of one grid by cycling iteratively through the placement grids, as shown in FIG. 6B for the example of stripe s11 associated with grid G1. At the beginning and at the end of the stripe the exposure method may not produce a contiguous covering, so there is a margin mr of width $L-L_G$ that is not completely filled.

As illustrated in FIG. 6C, the exposure of the pixels belonging to the other grid G2 (or the other grids, if $n_g > 2$) is done by writing another stripe s21. According to many embodiments of the invention, the placement of the stripes of different grids is with an offset perpendicular to the scanning direction. Within the area of overlap of the stripes s11, s21, the pixels thus exposed can combine into a complete coverage of the pixels to be exposed. However, the stripes s11, s21 will generally not be exposed in immediately successive order, as explained in more detail in the following with reference to FIGS. 7 and 8.

According to numerous embodiments of the invention, the imaging of the stripes is done according to a number of passes, where each pass contains a number of stripes. Preferably, the stripes of each pass are associated with the same partial grid of an exposure cell, and the stripes of one pass are preferably located side-by-side, so as to cover the total width (as measured across the scanning direction sd of the stripes) of the area to be exposed.

Figure 7:
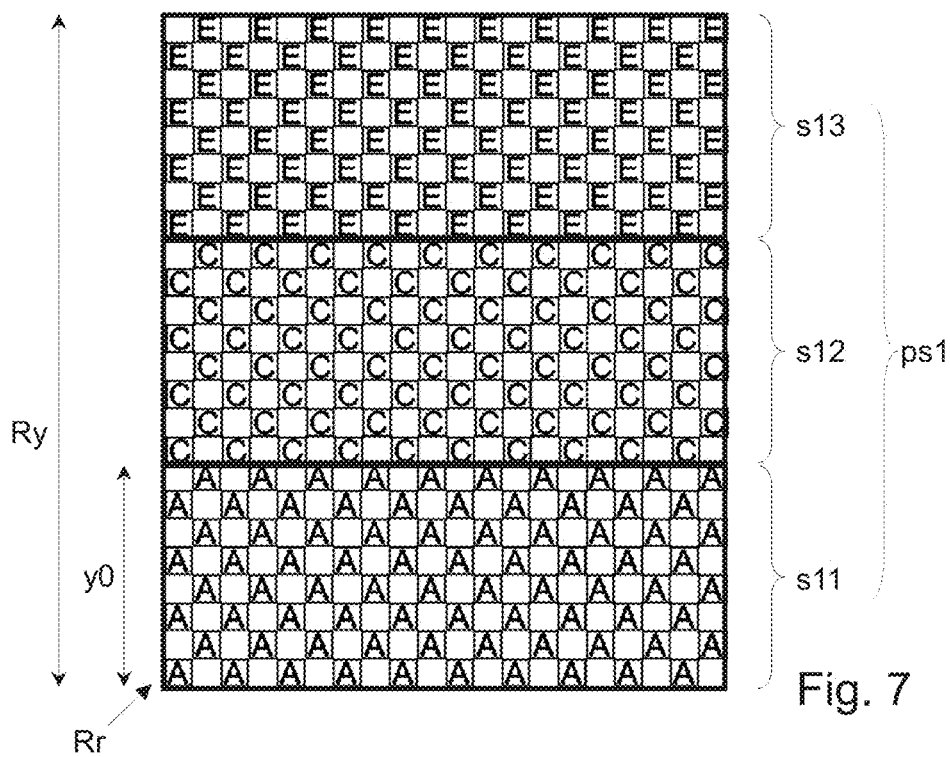
FIG. 7—shows the pixels that are exposed during the first pass of stripes.
Figure 8:
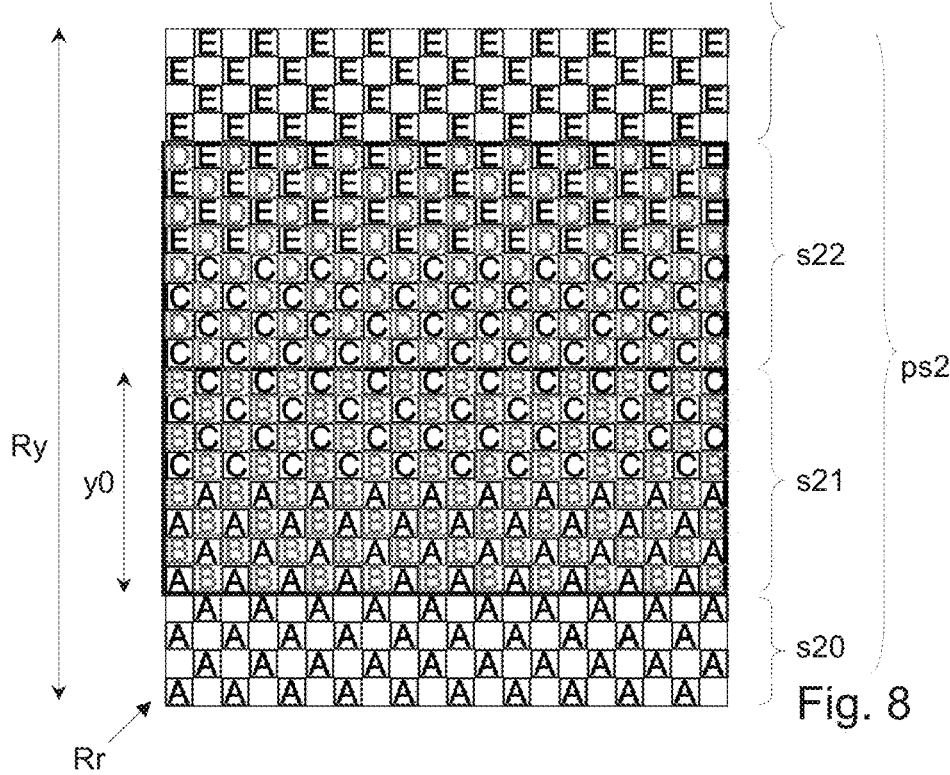
FIG. 8—shows how two passes combine into a complete coverage of the pixels on the target.

With regard to FIGS. 7 and 8, which show an exemplary sub-area of the target to be exposed, the first embodiment includes two passes ps1, ps2. In the first pass ps1 the stripes s11, s12, s13 are exposed in consecutive order, thus exposing the pixels belonging to grid G1. (The number of pixels within each of the stripes is reduced in the depiction of FIGS. 7 and 8 for the sake of clarity.) In FIG. 7, letters A, C, E denoted the pixels which are exposable thru stripes s11, s12, and s13, respectively. The stripes s1'-s13 of one pass are preferably located side-by-side, so as to produce a continuous grid over the area on the target. In this way, the stripes, each having individual width y0, cover the total width Ry of the area Rr to be exposed along the Y direction (i.e., across the scanning direction sd). The stripes s11-s13 may extend to either side of the area shown, and the first pass ps1 may continue with further stripes (not shown) after the stripe s13 has been imaged. After completion of all stripes of the first pass ps1, the stripes of another pass ps2 are performed, as illustrated in FIG. 8. The stripes s21, s22 expose pixels formed within the second grid G2. FIG. 8 shows two stripes s21, s22, which expose the pixels denoted by letters B and D, respectively. Thus, each pass ps1, ps2 is associated with one of the partial grids G1, G2 of pattern pixels which are exposable during the respective pass. Taken together, the pixels of the grids G1, G2 combine to the complete plurality of pattern pixels in the region which is to be exposed. In other words, the second pass ps2 exposes those pixels which are left out in the first pass ps1, and vice versa. For exposing the first half of the stripe s11, and to also cover this part of the total width Ry, an additional 'edge stripe' s20 (not indicated in the pixel pattern) may be performed, in which only the upper half of the pixels are exposed, while the lower half of the pixels are kept switched-off along the entire length of the stripe s20.

It will be clear that the information of the actual pattern to be exposed is superimposed to the pixels exposed on the target as shown in FIGS. 5-8, even though (for the sake of clarity) that actual pattern image information is not shown in those drawings. In other words, each of the pixels exposed during the stripes will be imparted a gray level according to the actual pattern, rather than a full exposure level. Furthermore, since the stripes of different grids are used to expose pixels of mutually different nominal locations on the target, different pixel locations of the actual pattern, which generally will import different exposure information (gray levels), are exposable by means of these pixels of the various partials grids. For illustration, FIG. 6C shows a simplified example of an actual pattern 15' produced within the region of overlap of the stripes s11, s21; in a realistic example, each of the pixels will be exposed in accordance with the actual gray levels of the actual pattern 15'.

Figure 15:
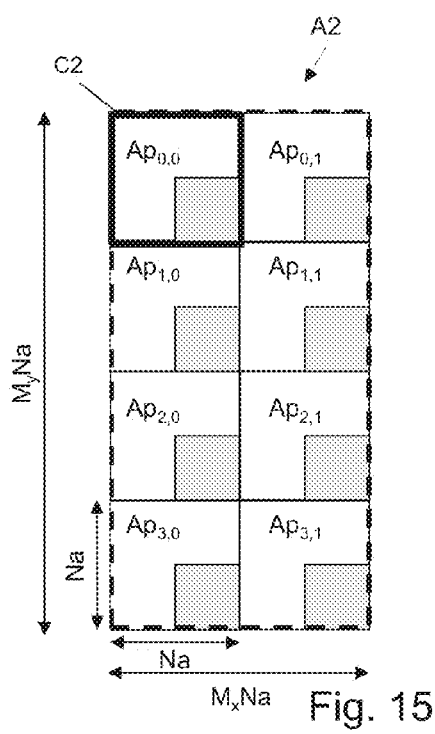
FIG. 15—shows another arrangement of apertures with $M_x=4$, $M_y=2$, $N_x=2$, $N_y=2$ FIG. 16—shows a further illustration of writing two passes with the example of FIG. 15.

FIG. 15 gives a further example for an aperture arrangement A2 in a PD device used for stripe writing. In this implementation variant, the dimensions of the PD device are $M_x = 4$, $M_y = 2$, $N_x = N_y = N = 2$, the size of the aperture image is a. Pixels will be written with an oversampling factor of o=1 in this example (without loss of generality). An 'exposure cell' C2 thus has a size of Na×Na, and $N^2$ pixels have to be addressed per cell. In FIG. 15 the aperture images exposed at one instance in time (shown shaded) are denoted by reference symbols $Ap_{0,0}$, ... $Ap_{3,1}$, i.e., $Ap_{i,j}$ with two indices $i<M_x$, $j<M_y$ representing their location within the aperture array.

Figure 16:
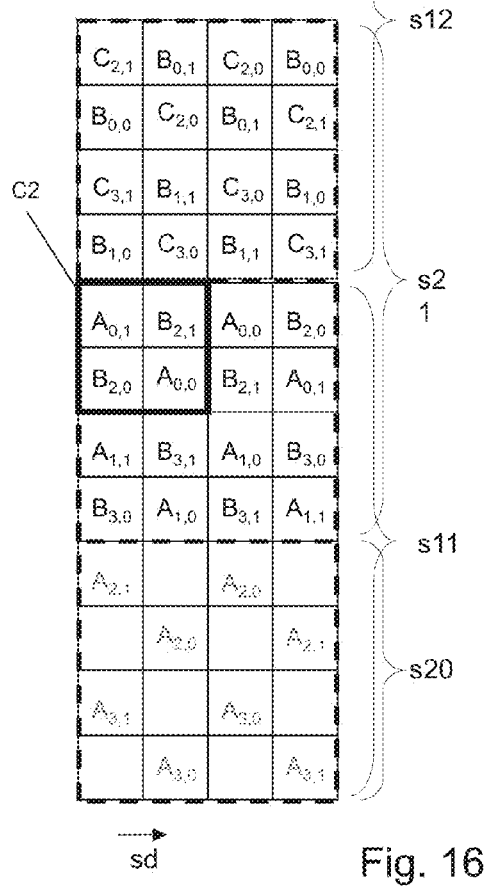

FIG. 16 shows the application of the PD device arrangement of FIG. 15 according to certain embodiments of the invention for $n_g=2$. First a stripe s11 with width $M_y \times N \times a$ will be written in the first pass ps1. The pixels exposed are depicted in the figure with a reference symbols of the type $A_{i,j}$ ($0 \leq i < M_x$, $0 \leq j < M_y$) and are located on grid G1. Note that only $N^2/n_g=2$ pixels are written per cell C2, leading to 2 times the basic writing speed (i.e. the stripe is completed in the first pass twice as fast by addressing only half of the pixels). In order to ensure that all required pixels are exposed, an additional transverse deflection is introduced during the motion of the image along the scanning direction so the aperture images can cover all required pattern pixel positions that belong to the grid G1. This can be provided, for instance, by the deflection means 16. In a next step a further stripe s12 is written employing the same method and with pixels denoted in the figure with reference symbols of type $C_{i,j}$.

In the second pass ps2 stripes s20, s21 with an offset being equal to half of the stripe width (of stripes s11, s21) are written. For this second pass, pixels on a grid G2 different to grid G1 are printed (pixels of stripe s21 are denoted as $B_{i,j}$; pixels of stripe s20 are left clear in FIG. 16).

Thus, certain embodiments of the invention achieves two major advantages: Firstly, within one exposure cell neighboring pixels are written by apertures that are not direct neighbors (with regard to the principal axes of the PD device). This is even more pronounced for a large PD device with $M_x \gg 4$ and $M_y \gg 2$ than in this simple example, where a small PD device was chose to enhance clarity.

As a second advantage it is noted that the double ($n_g=2$) pass does not introduce a smaller overall writing speed because only a fraction (here: half) of the pixels are written per pass while the mutually disjoint fraction (here: the other half) is written in the subsequent pass. As a consequence, the overall writing speed stays nearly the same as long as overhead time by stage re-positioning between the individual stripes remains negligible.

Note that the incomplete half-stripe with a width equal to s20 is printed with all beamlets switched off, so all pixels falling in this half-stripe are dark/unexposed.

FIG. 9 illustrates a method according to an embodiment of the invention. In this case, the stripes u11, u12 are overlapping along their longitudinal edge in a small region m12. This region m12 is referred to as 'overlap margin'. Likewise, the stripe u12 overlaps with the next stripe u13 in an overlap margin m23; and in the second pass, the stripes u21, u22 overlap along an overlap margin m2. The imaging of the individual stripes u11-u22 is basically the same as with the previous embodiment of FIGS. 5-9. The pixels which are exposed in the overlap margins are exposed within only one of the associated stripes. For instance, FIG. 10 shows a detail of the overlap margin m12. (For better clarity the number of pixels within the overlap margin is small in the depiction of FIG. 10; in realistic implementations, the width of an overlap margin may be up to several tens or even hundreds of pixels.) In the overlap margin 12, each of the pixels associated with grid G1 is either exposed in stripe u11 or u12, as indicated by letters A and C, respectively, whereas the pixels of grid G2 are exposed in the second pass via stripe u21, as indicated by the letter B. Thus, the overlap margin m12 shows a 'mixing' of pixels A and C. In the adjacent areas outside the overlap margin m12, the pixels of the grid G1 are not 'mixed', they are all of type A (stripe u11, below the margin) or of type C (stripe u12, above it). It is important to note that each overlap margin m12, m23, m2 is located completely within the area, preferably near or in the center, of a stripe u21, u22, u12 from a different pass. Thus, for each pass, the stripes u11-u13 (first pass) and u21, u22 (second pass) cover the entire width Ry' of an area R2 to be exposed on the target.

It will be clear that within many embodiments of the invention, the number $n_g$ of grids can be higher than two. FIG. 11 illustrates an example with $N=n_g=3$. The exposure cell with 9 pixels is distributed into three partial grids Ga, Gb, Gc which each contain the same number of pixels. Thus, grid Ga comprises pixel positions p1a, p2a, and p3a; grid Gb is formed by pixels p1b-p3b, and grid Gc has p1c-p3c. Referring to FIG. 12, for each grid Ga, Gb, Gc a sequence of stripes sa1, sa2, ..., sc2 is performed within a respective pass psa, psb, psc. The stripes sa1-sa3 of the first pass psa are overlapping so as to form overlap margins as discussed with reference to FIG. 10, and likewise the stripes sb1 and sb2, sc1 and sc2 of the other two passes. The stripes are, preferably, offset to each other along the Y direction such that each overlap margin completely falls within the area of a respective stripe of the other passes. In other words, the overlap margins of different passes, preferably, do not overlap. Thus, the offset between the stripes of different passes is different from an integer multiple of the stripe width y0 (discounting the width of overlap margins) by a fraction of the stripe width y0, which fraction may, for instance, substantially equal the inverse of the number of passes (or the number of grids, $n_g$) times the stripe width y0.

FIG. 13 shows one possible variant of a partial grid layout, in which the pixel positions of each of the partial grids Ga'-Gc' is within one line. With this layout, it is sufficient to shift the pattern image only along the X direction within the exposure of a stripe, thus disposing of need for small beam shifts along the Y direction.

The sequence of pixel positions for the first $n_g-1$ passes is, in fact, arbitrary and may be programmed. The only constraint is that partial grids of subsequent passes are mutually different, and preferably disjoint, from previous passes. At the last pass, the partial grid is not arbitrary any more but follows from all the previous passes and covers the remaining pixels.

In the special case of $n_g=2$ passes only the sequence of pixel positions of the first pass is arbitrary.

In the embodiments so far, the passes are performed subsequently in time, that is, first all stripes of the first pass are exposed, then all stripes of the second pass, and so on. While this is one preferred way of temporal sequence of the stripes, it is generally possible within many embodiments of the invention to freely vary the temporal order of exposing the stripes.

Stripes Groups

FIG. 14A shows another preferred variant of a temporal order of stripes. Here, the stripes of one pass pp1, pp2 are exposed in groups to cover areas A1a, A1b, A1c, ... of the area R3 to be exposed on the target. Each of the areas A1a-c is a stripe-shaped sub-region within the area R3, comprising a number k of stripes (with k=4 in the example shown), but the areas are separated from each other, namely, by areas A2a, A2b, ... which are exposed only after the series of areas A1a, A1b, A1c, ... have been finished. More specifically, the sequence of the stripe exposures is as follows: First, stripes s1a1 through s1a4 of a first group t1a of stripes is performed according to a first grid which is associated with the first pass pp1, then stripes s2a1 through s2a4 of a second group t2a of stripes is performed according to a second grid associated with the second pass pp2. Thus, the stripes of the groups t1a, t2a expose and substantially cover the first area A1a (that is, except for lateral 'edge stripes' along the two longitudinal edges of the area A1a). Next, the area A1b is exposed, by performing the stripes s1b1 through s1b4 of a third group t1b and then the stripes s2b1 through s2b4 of a fourth group t2b. After this, area A1c is exposed, and so on. After this sequence of areas A1a, A1b, A1c, . . . another sequence starts with exposing area A2a, which is done in a manner analogous to that of area A1a.

Of course this example can be extended to cases with other number of passes, groups, and number of stripes in the groups. Summarizing this variant, the passes are performed in a temporally interlacing order, where a number of adjacent stripes of same pass are performed in immediate consecutive order; and groups of stripes are performed for alternating passes i.e., after a group of stripes belonging to one pass a group of stripes of a different pass is performed.

Sparse Stripes

Figure 14B:
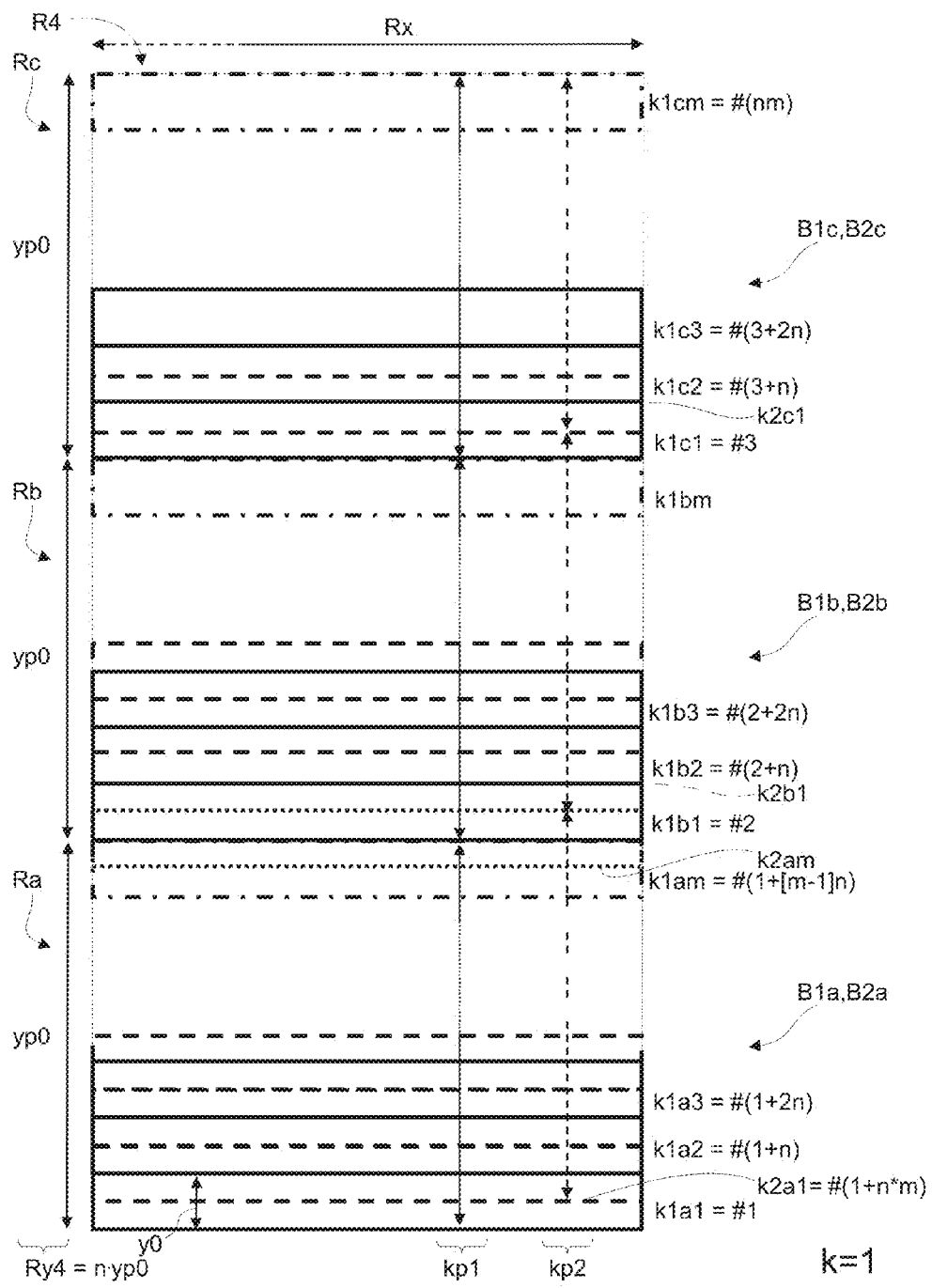
FIG. 14B—illustrates a further variant of the temporal sequence of exposing stripes.

In another variant, as illustrated in FIG. 14B, the number of stripes in each group is minimal, i.e., each group contains only one stripe for each pass, k=1. This variant, which is herein called 'sparse stripes', might be seen as a limiting case of the procedure of FIG. 14A. In this variant of the temporal sequence of exposing stripes, there is a wide pitch between each stripe and the immediately subsequent stripe of same pass. This "wide pitch" yp0 is larger than at least the double width of a single stripe, but typically a multiple of the width y0, i.e., yp0=m·y0. The multiplier m is a number of at least two, preferably an integer; typically, the multiplier is well above 2. In particular, in the specific example of FIG. 14B, the area of the region R4 is divided along the Y direction into n=3 sub-regions Ra, Rb, Rc (generally, n may take any integer value larger than one) of a basic width yp0; thus the total width of the region R4 is Ry4=n·yp0. As with the previous examples, all stripes in the region R4 are oriented parallel and preferably have same length Rx. Each sub-region is exposed through m stripes for each pass, but in a temporal order as indicated in FIG. 14B by symbols #1, #2, . . . of type #i, where the integer number i can be interpreted as a "time index". Thus, the first pass will comprise n·m stripes in the following order: k1a1, k1b1, k1c1, k1a2, k1b2, k1c2, . . . k1am, k1bm, k1cm (the letters a, b, c respectively denoting the n=3 sub-regions Ra, Rb, Rc in FIG. 14B); after which the stripes k2a1, . . . k2am, k2b1, . . . of the second pass are performed in analogous order. The first stripe k2a1 of the second pass kp2, since it follows right after the last stripe k1cm of the first pass, may be seen as having a "time index" of 1+n·m, and so on for the further stripes of the second pass. In FIG. 14B not all of the stripes are shown for better clarity; furthermore, the last stripe k1am, k1bm, k1cm of each sub-region for the first pass kp1 is shown with a dash-dotted line, and the last stripe k2am of the first sub-region of the second pass kp2 with a dotted line.

Of course, in other realizations the sequence of the stripes of the sparse stripes approach may be varied as well. In a particular modification, the sequence of exposure of the stripes could be such that after each set of n stripes of one pass a set of n stripes of the next pass is performed; after cycling through the passes in this way, the procedure is continued with the next stripe for each sub-region. Thus, in terms of the stripes shown in FIG. 14B, the sequence of exposure of this variant, for the stripes of both passes, is: k1a1, k1b1, k1c1, k2a1, k2b1, k2c1, k1a2, . . . .

In other words, with the "spares stripes" method, the stripes of each sub-region belonging to one pass (for instance the first pass kp1) can be considered as a grouping (for instance grouping B1a, B2a, B3a for sub-regions Ra, Rb, Rc, respectively), and the time sequence of writing the stripes is such that each stripe is followed by a non-adjacent stripe of a different grouping, typically of the same pass, but possibly also of a different pass (groupings B2a, B2b, B2c).

"Scheduler": Determining the Writing Procedure

According to further embodiments of the invention a method is proposed which enables breaking down a layout, which is to be written on a substrate (which, in a typical implementation, may be a 6×6 inch standard mask blank), into stripe-shape segments in a suitable way. This is done by an algorithm which can be implemented in a suitable software program, as described in the following with reference to FIG. 18. The algorithm accepts, as input 800, the vector data of the layout which is to be produced on the substrate, e.g. a large set of polygonal shapes.

The method provides an advantageous way of dividing the structures into stripes or a group of stripes and choosing an advantageous temporal sequence of writing these stripes to the substrate. The main technical problem to be solved is the following: Mask writing tools suffer from the thermal load imparted to the substrate by the beam of charged particles during the write process. As mentioned earlier, the beam consists of energetic particles, such as electrons with a kinetic energy of e.g. 50 keV. For a total beam current of 1 $\mu$A (in the case where all individual beamlets are switched on) this corresponds to a heating power on the substrate of 0.05 W concentrated on the image field of approx. $10^4$ $\mu m^2$. The localized heating power quickly leads to a significant temperature increase at the exposed portion of the substrate and, consequently, strain and stress of the substrate. Even with modern equipment and a maximum of precaution in the choice of cooling and materials, relative displacements between the location of the electron beam and the target location on the substrate of several nanometers can occur due to a rise in temperature by (typically) 1-2 K for the case of a 6-inch quartz-glass mask blank. In a case where sub-nanometer precision is needed for the beamlet placement, this will be inadequate since it causes strain effects exceeding the tolerances of sub-nanometer requirements.

While a reproducible, stationary displacement pattern caused by e.g. a constant temperature gradient in the substrate may still be corrected for by employing correction maps, dynamic writing of an arbitrary vector layout is almost impossible to correct in such a way. Thermal effects will in general depend on parameters such as the placement of regions to be written, their pattern density, and the order of writing. Consequently, it is often insufficient to impose a uniform, predetermined correction map to compensate for displacements caused by thermal effects. Rather, these unwanted thermal displacements need to be reduced or altogether avoided.

In order to resolve these issues, a novel algorithm is proposed. FIG. 18 shows a flow diagram illustrating this algorithm, which is also referred to as "scheduler". The scheduler algorithm divides the structures to be written into stripes or group of stripes and chooses an advantageous temporal sequence of printing those stripes.

Starting from the vector data, a first step is to break down the structure into a set of equally sized stripes. The orientation of the stripes is given by the preferred scanning direction of the moving stage. Without loss of generality, the scanning direction is chosen as X-direction; this is in conformance with the present figures, in particular FIGS. 14A,B. The width of a stripe (dimension across the scanning direction, here along Y direction) usually corresponds to the width of the image field and is denoted again by y0.

Figure 19:
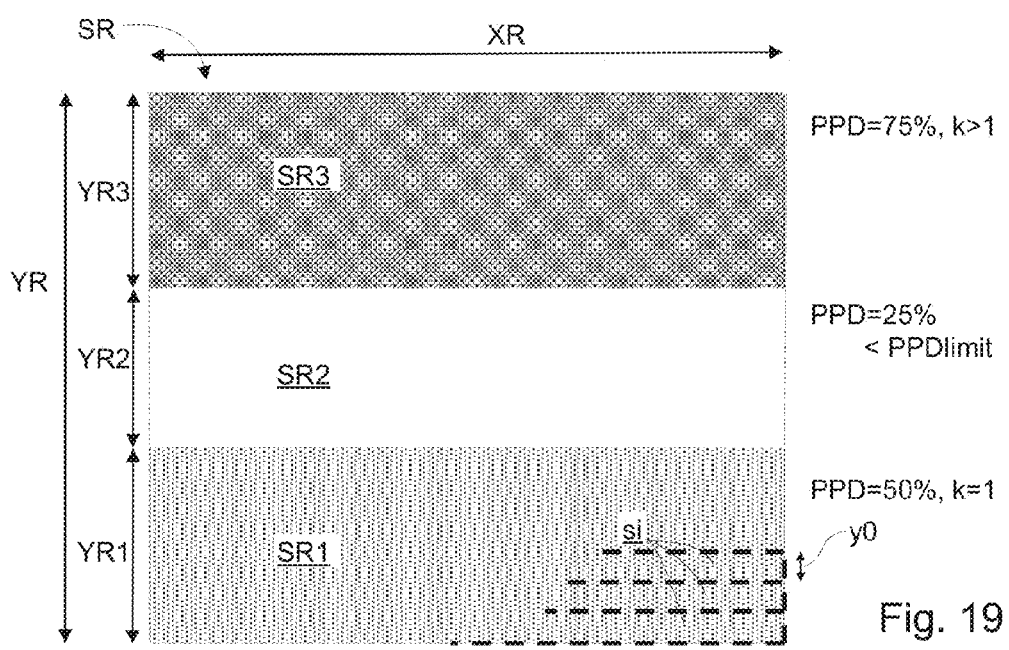
FIG. 19—shows a region on a substrate to be exposed that is broken into sub-regions according to the algorithm of one embodiment of the present invention.

In the one simple case, the layout in an area on the substrate to be exposed is broken up into a sequence of N stripes; an example is given in FIG. 19, showing an exemplary substrate area SR having dimensions XR×YR. The stripes are also denoted si, with i=1 . . . N. Each of the stripes has the dimension XR×y0, and the stripes si of each pass sequentially (i.e., in a spatial sequential order from the origin, which is e.g. at the lower left-hand corner of region R4 in FIG. 14B) cover the substrate area. In FIG. 19 only the right-hand ends of the first three stripes of a first pass are shown, where the size of the stripe width y0 is exaggerated with regard to the width YR of a typical substrate area SR, for better clarity. The number N of the stripes in a pass is preferably chosen so as to meet the condition (N−1)*y0<=YR<=N*y0. The vector data contained in the stripes is then converted to rasterized pixel data, using a suitable rasterization algorithm, and the pixel data of the stripes are sequentially imaged to the substrate. This method is equally well applicable to a double-pass approach and also double-pass with stripe-overlap, as shown in FIGS. 7-12.

Thus in this first step 801 (FIG. 18) the scheduler algorithm breaks up the substrate area SR along the Y direction into a set of smaller sub-areas SR1, SR2, . . . , referred to as "regions", having a width along the Y direction chosen between a predetermined minimum size and maximum size. For instance, the minimum size may be 3*XR*y0 and the maximum size XR*YM, where YM is a maximal Y dimension typically between a few mm and YR/2 as largest value. In sum, these regions cover at least the whole substrate area SR to be exposed. The regions are chosen such that each has a preferably homogeneous (mean) pattern pixel density (PPD). The PPD is defined as the fraction of exposed pixels among the total number of pixels within each region, weighted at each pixel by the pixel's greylevel. The regions will, in general, comprise the area of a plurality of stripes.

For instance in the example of FIG. 19 the area SR is, in accordance with the underlying vector data layout (not shown in FIG. 19), divided into three regions SR1, SR2, SR3 of respective widths YR1, YR2, YR3. In this example, we assume the PPD in these three regions is 50%, 25%, and 75%, respectively. Of course, the number and widths of the regions may vary in other realizations depending on the underlying vector data.

In the next step 802, each region is checked whether its PPD is above or below a certain threshold value PPDlimit, which is defined depending on the properties of the target material involved in the process, such as resist heating and substrate parameters; usual values of PPDlimit are between 20% and 50%. Thus, the regions fall into two sets, which respectively are the set of regions with PPD≤PPDlimit ("sequential set") and those with PPD>PPDlimit ("sparse set").

For regions of the "sequential set", having comparatively low PPD, one can expect that beam-induced substrate heating during writing is not critical. Those regions are written in step 803 using a sequential writing procedure of the stripes in the respective region, namely, writing all stripes of one pass in immediate consecutive order and then writing the stripes of the next pass. This corresponds to the methods described above with reference to FIGS. 7 to 13. For example, in FIG. 19 with PPDlimit=30%, the region SR2 has a low PPD and is, therefore, written with a sequential writing procedure.

The regions of the "sparse set", on the other hand, have a generally large PPD. Therefore, beam-induced substrate heating can be problematic during writing of these areas. In order to avoid these effects, the temporal order of stripes is altered in a suitable manner which will avoid that (spatially) neighboring stripes are exposed in immediate sequential order. A boundary condition for the re-ordering the stripes located within the region to be exposed is the efficiency of data preparation and data transfer to the PD device, which involves, for example, the rasterization process and the overhead time of the moving stage (enhanced travel time). In order not to decrease this "data path" efficiency too much, one main aspect of many embodiments of this invention is that stripes are re-ordered primarily in groups, to be written with a method employing stripe groups or sparse stripes as discussed above with reference to FIG. 14A and FIG. 14B, respectively.

In step 804 the parameters for the "sparse stripes" method (FIG. 14B) are determined for the regions of the "sparse set". A suitable choice of the pitch yp0 is made as follows. First, for a region of dimension XR×YRi the total number of stripes for one pass in this region is determined, as m=ceil(YRi/y0). Then the pitch for the stripe groups yp0 is calculated from the total width of the area SRi (e.g. SR1, SR2, SR3) through the relation yp0=YRi/n, wherein an integer n is used which is determined through a pre-installed function dependent on the PPD. Suitably n is a function defined on the interval [PPDmin, PPDmax] as a decreasing function (PPDmax is typically much larger than PPDlimit and may also approach 100%, depending on the substrate exposure process; PPDmin is a lower limit which often is 0% but may be a finite value below the value of PPDlimit). For instance, n(PPD) is mainly an inversely proportional function of the PPD of the type n(PPD)=floor(n1+n2/PPD), with n1 and n2 being two integer parameters, which are chosen such that n(PPDmin)=m, and n(PPDmax)=nmin. Here, nmin is the predefined maximum pitch count of (groups of) stripes. Its value is at least 2, since the stripe pitch may only be as large as yp0=YRi/2. After all, yp0 must be limited so that write efficiency is not affected by the enhanced travel times of the substrate stage. Typically, yp0 should not be larger than some tens of mm. For values out of the interval [PPDmin,PPDmax], the integer n will be given the value of m (PPD<PPDmin) or nmin (PPD>PPDmax).

For n=nmax=m the pitch yp0 is equal to the stripe width y0 and in this limit, writing of stripes is performed by consecutive writing 803. On the other hand, the value nmin=n(PPDmax) is determined by the efficiency or speed of the data path and stage travel time (see above). For too low values of n vector data of structures to be written would be stored too far away in memory and/or yp0 (and thus overhead time of the moving stage) becomes too large to meet criteria for total write time; to avoid such a situation, it is proposed that n be bounded from below by nmin (corresponding to a bound for yp0 from above by a maximum value yp0max)

In a next step 805, the size k of the stripe groups (cf. FIG. 14A) is determined. For reasons of data path and stage movement efficiency, it is advantageous to write not only one stripe, but a group of k stripes before moving to a different area. On the other hand, substrate heating, which depends on the heating power of the beam, the substrate material, and on the density of the arrangement of stripes on the substrate limits the size of stripe groups. Thus, substrate heating is proportional to k and inverse proportional to the pitch for stripe groups yp0. Overall, it is advantageous to choose k as large as possible but still small enough to take substrate heating into account. In short, n×k=A1 (or equivalently, k=A1/n), where A1 is an integer-valued constant depending now only on the heating power of the beam and the substrate material. Suitable values of A1 are between 10 and 40 usually.

In the case k>1 (i.e., n<A1), box 806 of FIG. 18, the stripes are written in groups of size k before moving to the next area in a distance of yp0. A second is written after finishing the first pass (and then, possibly, a third pass and so on). This corresponds to the writing procedure with stripe groups as illustrated in FIG. 14A. For example, in FIG. 19 the region SR3 having PPD=75% is written with a sequential writing procedure.

In the case k=1, box 807, which occurs whenever n≥A1, stripe groups consist only of a single stripe. This corresponds to a writing method of the "sparse stripes" kind as illustrated in FIG. 14B. After writing a single stripe, the next stripes is written in a distance yp0. A second (or third pass) is written after finishing the first pass. For example, in FIG. 19 the region SR1 having PPD=50% is written with using the "sparse stripes" method.

The invention claimed is:

1. A method for irradiating a target with a beam of energetic radiation formed by electrically charged particles, comprising the steps of providing a pattern definition means having a plurality of apertures transparent to said radiation, illuminating said pattern definition means by means of an illuminating wide beam, which traverses the pattern definition means through said apertures thus forming a patterned beam consisting of a corresponding plurality of beamlets, forming said patterned beam into a pattern image on the location of the target, said pattern image comprising the images of at least part of the plurality of apertures covering a number of pattern pixels on the target, and generating a relative movement between said target and the pattern definition means producing a movement of said pattern image on the target along a path over a region where a beam exposure is to be performed, said region being composed of a plurality of pattern pixels arranged in a regular arrangement and having a total width as measured across a main direction of said relative movement, said movement defining a number of stripes covering said region in sequential exposures, said stripes running substantially parallel to each other along said main direction and having respective widths as measured across said main direction, wherein the number of stripes is written in a consecutive order in at least two passes, wherein each stripe belongs to exactly one of said passes, wherein for each pass, the widths of the stripes of one pass combine into a cover of the total width, wherein each pass is associated with one of a number of partial grids of pattern pixels which are exposable during the respective pass, the partial grids being mutually different and, when taken together, combining to the complete plurality of pattern pixels which compose said region where a beam exposure is to be performed.

2. The method of claim 1, wherein the stripes of each pass are distributed into at least two groups of spatially adjacent stripes, and the stripes are written either in a time sequence wherein either each stripe is followed by a non-adjacent stripe of a different group, or in a time sequence wherein the stripes are written in groups of stripes according to the order of the groups, with each group of stripes being followed by a non-adjacent different group.

3. The method of claim 2, wherein the passes are written in a temporally interlacing order, by writing groups of at least two stripes belonging to a respective one of the passes in immediate consecutive order, and groups of stripes are written for alternating passes.

4. The method of claim 3, wherein groups of stripes covering substantially the same area on the target are written in immediate consecutive order.

5. The method of claim 1, wherein groups of stripes belonging to the same pass are written subsequently in time.

6. The method of claim 1, wherein the stripes are located such that for each stripe, a boundary of said stripe having an orientation parallel to said main direction falls within a central region of a stripe of a different pass.

7. The method of claim 1, wherein the stripes of each pass have uniform width, the stripes of different passes being offset to each other by an offset value which is substantially equal to an integer multiple of the width plus a fraction of the width, said fraction corresponding to the inverse of the number of passes.

8. The method of claim 1, wherein within each pass consecutive stripes are exposed at lateral offsets to each other which correspond to the respective widths of the stripes.

9. The method of claim 1, wherein the stripes of at least one of the passes are overlapping, wherein in the range of overlap of two stripes of the same pass:

nominal positions of pattern pixels of one of the two stripes are overlapping with nominal positions of corresponding pattern pixels of the other of the two stripes, and pattern pixels are exposed in the two overlapping stripes in a complementary manner with regard to the pattern to be imposed.

10. The method of claim 1, wherein within each stripe, the pattern pixels are selectively exposed according to an actual pattern to be exposed, wherein through pixels of different partials grids different pixel locations of the actual pattern are exposable.

11. The method of claim 10, wherein the total width is divided into a number of regions, and for each region, depending on a comparison between a pattern pixel density evaluated based on the actual pattern within the respective region and a predetermined threshold value and/or a comparison between the number of groups per pass in the respective region and a predetermined constant, a decision is made for the time sequence of writing the stripes, namely, between a time sequence wherein each stripe is followed by a non-adjacent stripe of a different group, and a time sequence wherein the stripes are written in groups of stripes according to the order of the group, with each group of stripes being followed by a non-adjacent different group.

12. The method of claim 10, wherein the total width is divided into a number of regions, and for each region, depending on a comparison between a pattern pixel density evaluated based on the actual pattern within the respective region and a predetermined threshold value and/or a comparison between the number of groups per pass in the respective region and a predetermined constant, a decision is made for the time sequence of writing the stripes, namely, between a time sequence wherein the stripes of each pass are written in immediate consecutive order, and a time sequence wherein either each stripe is followed by a non-adjacent stripe of a different group, or wherein the stripes are written in groups of stripes according to the order of the group, with each group of stripes being followed by a non-adjacent different group.

13. The method of claim 1, wherein during the uniformly timed exposure steps, during which respective pattern pixels are exposed on the target, the location of the pattern image is moved along with the target at least with respect to the relative movement along the main direction, and between exposure steps the location of the pattern image is changed with respect to the target, generally compensating the movement of the location of the pattern image with regard to the location of the pattern definition means, wherein the duration of said exposure steps corresponds to a uniform distance of advance along the main direction, said distance of advance being greater than the size of an aperture image within the same partial grid along the main direction.

14. The method of claim 1, wherein the positions of the images of apertures on the target are arranged according to a two-dimensional regular arrangement defined in the pattern definition means.

15. The method of claim 1, wherein the partial grids are mutually disjoint with regard to nominal positions of images of apertures which define pattern pixels.

16. The method of claim 1, wherein the partial grids have a pitch being equal or smaller than the width of the images of apertures on the target.

17. The method of claim 16, wherein the regular partial grids are placement grids employing oversampling with an oversampling factor o>1.

18. The method of claim 16, wherein the pitch is equal to the width of the images of apertures on the target times $\frac{1}{2}^{ke}$, with ke being a positive integer.

* * * * *